United States Patent

Tanahashi et al.

[11] Patent Number: 6,142,363
[45] Date of Patent: Nov. 7, 2000

[54] SOLDERING METHOD USING SOLDERING FLUX AND SOLDERING PASTE

[75] Inventors: Akira Tanahashi, Anjo; Norihisa Imaizumi, Nukata-gun; Yuzi Otani, Okazaki; Takashi Nagasaka, Anjo, all of Japan

[73] Assignee: Nippondenso Co., Ltd., Kariya, Japan

[21] Appl. No.: 09/290,580

[22] Filed: Apr. 13, 1999

Related U.S. Application Data

[62] Division of application No. 08/568,236, Dec. 6, 1995, Pat. No. 5,919,317.

[30] Foreign Application Priority Data

Dec. 7, 1994 [JP] Japan ................................. 6-331168
Jul. 21, 1995 [JP] Japan ................................. 7-207445

[51] Int. Cl.$^7$ .................................................... B23K 31/02
[52] U.S. Cl. ........................... 228/224; 228/223; 228/24
[58] Field of Search .................................... 228/224, 223, 228/214; 148/24, 22, 23, 25, 26

[56] References Cited

U.S. PATENT DOCUMENTS

| | | | |
|---|---|---|---|
| 4,460,414 | 7/1984 | Hwang | ...................... 148/23 |
| 4,919,729 | 4/1990 | Elmgren et al. | ........................... 148/24 |
| 4,995,921 | 2/1991 | Davis et al. | ............................... 148/22 |
| 5,004,508 | 4/1991 | Mace et al. . | |
| 5,004,509 | 4/1991 | Bristol . | |
| 5,011,546 | 4/1991 | Frazier et al. . | |
| 5,064,480 | 11/1991 | Dershem et al. | ........................... 148/22 |
| 5,125,560 | 6/1992 | Degani et al. . | |
| 5,150,832 | 9/1992 | Degani et al. . | |
| 5,196,070 | 3/1993 | Ables et al. . | |
| 5,211,763 | 5/1993 | Takemoto et al. | ........................ 148/23 |
| 5,334,261 | 8/1994 | Minahara et al. . | |

FOREIGN PATENT DOCUMENTS

| | | |
|---|---|---|
| 0 077 622 | 4/1983 | European Pat. Off. . |
| 58-209497 | 12/1983 | Japan . |
| 59-153595 | 9/1984 | Japan . |
| 62-6795 | 1/1987 | Japan . |
| 63-33196 | 2/1988 | Japan . |
| 63-299888 | 12/1988 | Japan . |
| 64-5039 | 1/1989 | Japan . |
| 64/18600 | 1/1989 | Japan . |
| 2-290693 | 11/1990 | Japan . |
| 3-94995 | 4/1991 | Japan . |
| 3-106594 | 5/1991 | Japan . |
| 4-135092 | 5/1992 | Japan . |
| 5-42388 | 2/1993 | Japan . |
| 5-69188 | 3/1993 | Japan . |
| 5-69189 | 3/1993 | Japan . |
| 5-177385 | 7/1993 | Japan . |
| 5-185282 | 7/1993 | Japan . |
| 5-185285 | 7/1993 | Japan . |
| 5-200585 | 8/1993 | Japan . |
| 6-71481 | 3/1994 | Japan . |
| 6-87090 | 3/1994 | Japan . |
| 6-136299 | 5/1994 | Japan . |

*Primary Examiner*—Patrick Ryan
*Assistant Examiner*—M. Alexandra Elve
*Attorney, Agent, or Firm*—Pillsbury Madison & Sutro LLP

[57] ABSTRACT

Provided are a soldering flux or paste containing an organic substance which has at least two hydroxyl (—OH) groups in a molecule and of which the temperature at which the mass % becomes approximately 0% is not lower than approximately 170° C. and not lower than the solid phase linear temperature of the solder, as measured by thermal gravimetry in which a flow rate of an air or nitrogen ($N_2$) gas atmosphere is 200 ml/min and a rate of temperature rise is 10° C./min, and a soldering method using the same. The soldering flux or paste of the present invention gives good wettability to a matrix to be bonded in a normal temperature profile and in a non-reductive atmosphere without leaving any residue.

25 Claims, 20 Drawing Sheets

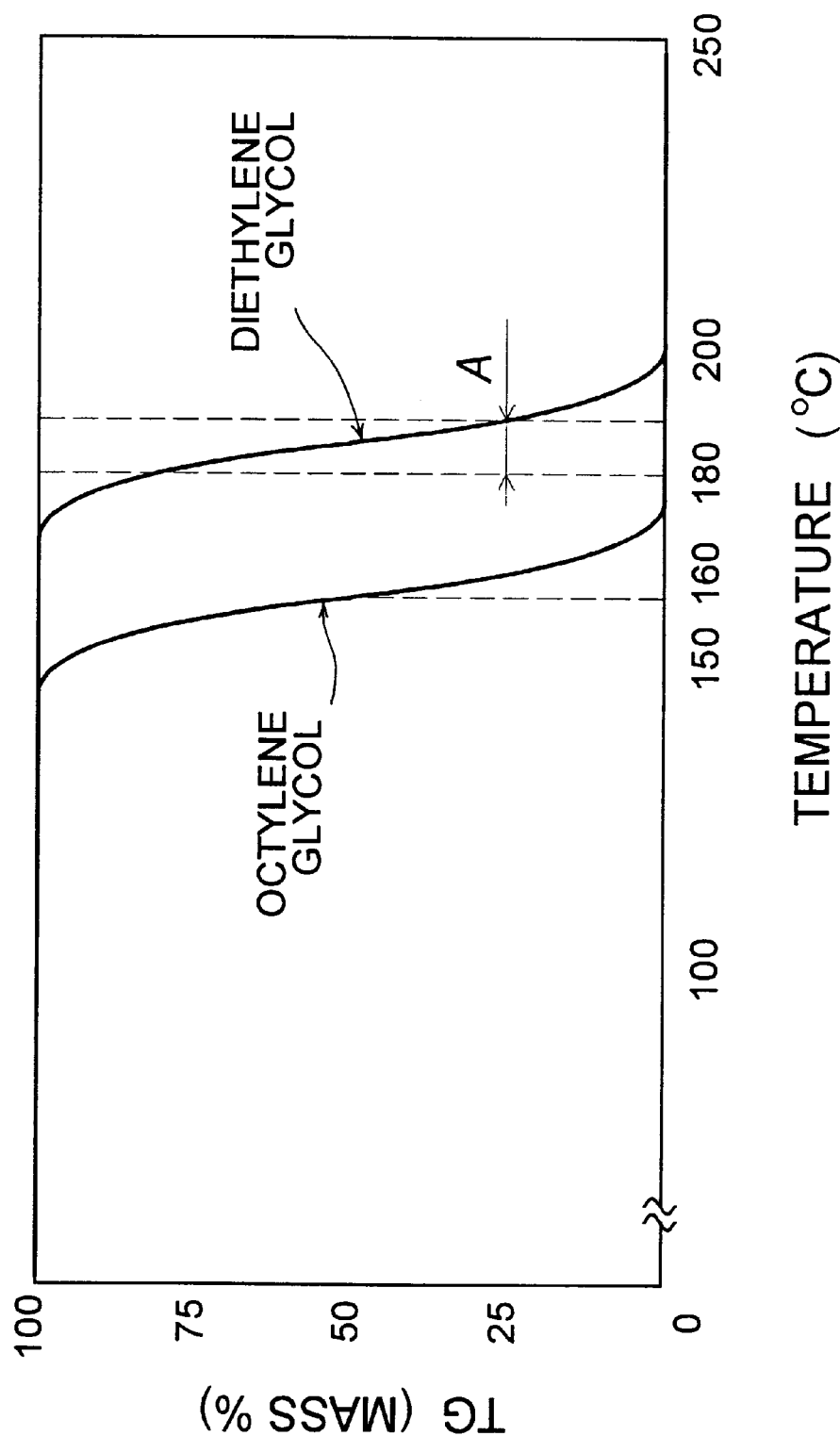

SOLDERING METHOD USING SOLDERING FLUX AND SOLDERING PASTE

CROSS REFERENCE TO RELATED APPLICATION

This application is a division of Application Ser. No. 08/568,236, filed Dec. 6, 1995 now U.S. Pat. No. 5,919,317 which was based upon and claimed the benefit of priority of, as does this division the prior Japanese Patent applications No. 6-331168 (Dec. 7, 1994) and No. 7-207445 (Jul. 21, 1995), the contents of which are incorporated herein by reference.

BACKGROUND OF THE INVENTION

1. Field of the Invention

The present invention relates to a flux which is used when a flip chip IC or an electronic component is soldered on a substrate, and a soldering method using the same. Further, the present invention relates to a soldering paste obtained by kneading a solder powder in paste form and a soldering method using the same.

2. Related Arts

A flux containing an organic acid and a halogen compound has been used so far in the soldering of a hybrid IC (HIC) and a print substrate.

However, in recent years, removal of flux has been attempted from the standpoint of environmental pollution, and the use of an unwashed flux containing small amounts of solids and having a low content of a residue or alternative aqueous washing is currently widespread. However, in the aqueous washing, washability is bad with respect to IC, such as HIC, having a connection pitch structure expected to become still finer in the future. Assuming that the washing can be conducted, leakage due to moisture absorption or the like seems to occur under severe conditions in storing IC in a vehicle when the drying is insufficient.

Meanwhile, without the washing, the flux containing the low content of the residue seems to give an adverse effect on a post-treatment such as a resin molding step or a wire bonding step.

Further, the soldering paste is generally composed of (1) a solder powder, (2) a solvent and (3) solids (rosin, activator and the like). Commercial unwashed products decrease the solids or are free from a halogen compound. However, after the soldering, the residue of the resin component such as a rosin or the like or the activator component occurs. Especially, the residue of the activator (activator itself or the reaction product) notably impairs reliability.

On the other hand, the residue of the resin such as a rosin is not so problematic in the soldering of the print substrate (for domestic use or for a vehicle). However, in the soldering of HIC, a soldering paste in which such a residue remains even in a small amount involves problems such as terminal leakage of a flip chip, corrosion of a circuit and reliability of wire bonding in the post-treatment. Accordingly, alternative flux washing or aqueous washing is conducted at present.

Recently, a soldering method in which no residue remains by causing a soldering paste to reflow using an alcohol has been proposed in Japanese Laid-Open Patent Application Nos. 2-290693 or 2-25291.

Japanese Laid-Open Patent Application No.2-290693 discloses a paste obtained by mixing a solder powder with an alcohol of which the boiling point is higher by approximately 30° C. than a melting point of a solder, such as a monohydric alcohol, a polyhydric alcohol or an ether. The present inventors have confirmed on the basis of the above-mentioned document that with an ether and a monohydric alcohol, no solder wettability is exhibited and no solder is spread in a non-reductive atmosphere (atmosphere in which a metallic oxide is not reduced). Further, in Examples using a polyhydric alcohol such as triethylene glycol, the alcohol has to be added in quite a high amount (approximately 15% by weight), and this is inappropriate in a printing paste. When the soldering is conducted using this printing paste, the level of the soldering is not good. Even if the printing paste is obtained using triethylene glycol in an amount of approximately 10% by weight, the solder does not become wet (solder is not spread), so that the soldering paste does not work.

Still further, according to the observation of the present inventors through a high-temperature microscope, almost all of materials of which the boiling point is higher by 30° C. than the melting point of the solder are evaporated before the solder is melted, the surface tension of the soldering cannot be decreased enough, and the solder is not spread.

In Japanese Laid-Open Patent Application No. 2-25291, the soldering is conducted in a reductive atmosphere to improve solder wettability, and to this end, a temperature of a reflow oven has to be as high as from 300 to 350° C. or higher.

That is, the soldering paestes proposed in these documents can be expected to be materials in which no residue remains, but good wettability cannot be expected in the non-reductive atmosphere or at normal temperatures.

SUMMARY OF THE INVENTION

An object of the present invention is to provide a novel activator which is suitable as a binder in forming a soldering flux or a soldering paste in which excellent wettability is given to a matrix as a portion to be bonded in a usual temperature profile and in a non-reductive atmosphere and no residue remains.

The present inventors have discovered that appropriate soldering can be conducted using an organic substance of which the component exhibits reducibility at the time of soldering and which is present in liquid state when starting the melting of a solder, and that in the analysis through thermal gravimetry (hereinafter referred to "TG"), the organic substance can be specified as a material suitable for a flux or a paste.

Incidentally, TG is one thermal analysis in which a minute change in the mass can precisely be detected. The information obtained through this analysis is used to evaluate a substance which is used as a soldering flux or paste. TG is carried out using a commercially available SSC-5200 measuring device manufactured by Seiko Denshi Kogyo K.K.

The soldering flux of the present invention is composed of one or more organic substances which are neither decomposed nor evaporated but are present in liquid state at a temperature to start melting of a solder in a soldering step and which are decomposed or evaporated at the time of the completion of the soldering step and which do not substantially remain in the soldered portion.

That is, the soldering flux of the present invention contains an alcohol having at least two hydroxyl (—OH) groups in a molecule and of which the temperature at which the mass % becomes approximately 0% is not lower than 170° C. and not lower than the melting point (solid phase linear temperature) of the solder, as measured by TG in which a flow rate of an air or nitrogen ($N_2$) gas atmosphere is 200 ml/min and a rate of temperature rise is 10° C./min.

The above-mentioned measurement is actually conducted using a sample in a small amount of from approximately 6 to 7 mg.

When a solder powder is mixed with, as a binder, a material which contains an alcohol having at least three hydroxyl (—OH) groups in a molecule and of which the mass % becomes approximately 0% is not lower than 235° C. and not lower than the solid linear temperature of the solder, as measured by TG in which a flow rate of an air or nitrogen gas atmosphere is 200 ml/min and a rate of temperature rise is 10° C./min, the resulting paste is suitable as a soldering paste.

In the usual method of specifying a flux or a paste in terms of a boiling point, a material in which an appropriate wet state of a portion to be soldered cannot be realized is included in the classification. Whereas, the method of specifying the —OH group-containing material through the TG which the present inventors have found, a material in which excellent wettability of the portion to be soldered and sufficient reduction of the solder surface are realized can surely be selected.

The evaluation through the TG shows characteristics correlated with a steam pressure of substances, making it possible to specify suitable substances also by the steam pressure. These substances reductively act on a solder, a substrate electrode and a component electrode as a soldering flux or paste to decompose the oxide on the surface, making the soldering easy.

In these substances, the flux is present on the portion to be soldered in liquid state at the time of melting the solder to give the wet state, and the reductive reaction helps to smoothly spread the solder throughout the substrate electrode and the component electrode, thereby providing the solder bond. At the time the soldering is completed, the flux is completely evaporated or decomposed and evaporated so that no residue occurs. Accordingly, the washing in the post-treatment is not needed.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 6 is a graph showing characteristics of octylene glycol and diethylene glycol through thermal gravimetry;

DETAILED DESCRIPTION OF THE PRESENTLY PREFERRED EXEMPLARY EMBODIMENTS

Figure 1A:
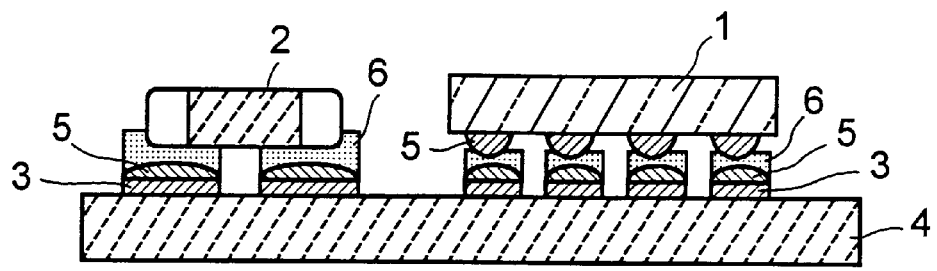
FIGS. 1A, 1B and 1C are each a schematic sectional view showing the reflow-soldering.

The preferable flux of the present invention will be described below.

The preferable flux composed only of the organic substance which has been found in the present invention is, like the conventional flux, effective without containing the conventional carbonyl group-containing organic substance or halogen compound-containing organic substance.

Especially, a glycol-type organic substance, a polyhydric alcohol-type organic substance, a saccharide or an alcoholamine-type organic substance having at least two —OH groups enhances reducibility in melting the solder, and decreases the surface tension of the solder, which makes the soldering easy and secure.

A soldering paste having a high level of evaporability does not act as a paste. Accordingly, preferable is a flux which is hard to evaporate in melting the solder, namely a flux in which the mass % at the melting point of the solder (approximately 180° C.; eutectic solder) is at least 89% or the steam pressure at the melting point of the solder is not more than 20 mmHg, as measured by TG in which a flow rate of an air or nitrogen ($N_2$) gas atmosphere is 200 ml/min and a rate of temperature rise is 10° C./min. Further, since the surface area of the solder is increased in the soldering paste, a higher level of reducibility is required when the organic substance of the present invention is used as a binder. Accordingly, the excellent soldering is realized using a flux having at least three —OH groups in a molecule. In this case, the wettability of the paste is quite excellent.

Especially when a solder powder is mixed with, as a binder, a specific material which contains an alcohol having at least three —OH groups in a molecule and of which the evaporation temperature is not lower than 235° C. as measured by TG in which a flow rate of an air or nitrogen gas atmosphere is 200 ml/min and a rate of temperature rise is 10° C./min, the evaporability can be decreased at the time of melting the solder, and the wettability in melting the paste can be increased.

The specific substance as the soldering flux of the present invention is specified in terms of the steam pressure as follows. The soldering flux is composed of at least one organic substance which has at least two —OH groups in a molecule and of which the mass % at the solder melting point of not lower than 170° C. (approximately 180° C.; eutectic solder) is not less than 18% as measured by TG in which a flow rate of an air or nitrogen gas atmosphere is 200 ml/min and a rate of temperature rise is 10° C./min. Further, the soldering flux is composed of at least one organic substance of which the steam pressure at the solder melting point is not more than 95 mmHg. The use of these fluxes gives the excellent wettability and spreadability in melting the solder and can suppress formation of the residue when the soldering is completed.

Examples of the main component of the soldering flux in the present invention include 1,3-dioxane-5,5-dimethanol, 1,4-dioxane-2,3-diol, 1,5-pentanediol, 3-methyl-1,5-pentanediol, 2,5-furandimethanol, n-butyldiethanolamine, ethyldiethanolamine, diethanolamine, tetraethylene glycol, triethylene glycol, hexaethylene glycol, pentaethylene glycol, 1,2,3-hexanetriol, 1,2,6-hexanetriol, 1,2,4-butanetriol, 2,3,4-trihydroxybenzophenone, 2',3',4'-trihydroxyacetophenone, 3-methylpentane-1,3,5-triol, glycerin, triethanolamine, trimethylolpropane, trimethylolethane, pyrogallol, erythritol, N,N-bis(2-hydroxyethyl)isopropanolamine, pentaerythritol, ribitol and bis(2-hydroxymethyl)iminotris(hydroxymethyl)methane. These compounds may be used either singly or in combination. The reflow-soldering is conducted using at least one of these compounds, making it possible to give the excellent wettability and spreadability of the solder and to prevent the formation of the residue after the completion of the soldering.

Especially when the solder powder is mixed with at least one of these compounds having at least three —OH groups in a molecule to form a paste, it is possible to exhibit the excellent wettability and to keep stable qualities even under such severe conditions that the product is placed in vehicles. Further, even if the soldering paste is mixed with a resin to form a paste, no residue is formed at the time of the completion of the soldering. Thus, the reliable soldering is possible.

When the substance having at least three —OH groups in a molecule is used as an activator of a flux in the soldering, the thixotropic properties are obtained, and the retention of components is increased.

When the distilled substance among the above-mentioned —OH group-containing substances is used as the main component of the soldering flux, impurities such as high-temperature components (oxides) present in the flux are removed. Consequently, it is possible to increase the purity of the flux, stabilize the insulation resistance value and conduct the high-quality soldering. To this end, the starting material which is the main component of the soldering flux may be distilled. Even with commercial materials, almost no residue remains when the soldering is completed.

The dip-soldering can be conducted well when using the —OH group-containing material of which the evaporation temperature is not lower than 185° C., regardless of the size and shape of the land portion, and no residue remains after the completion of the soldering. The material in which the temperature at which the mass % becomes approximately 0% is not lower than 190° C. is preferably used, whereby the soldering is possible through only one dipping.

Further, when using a soldering flux containing at least one material of which the —OH group/molecular weight ratio (—OH/molecular weight×100%) is not less than 17.5%, it is possible to increase the ability to remove an oxide film on a surface of a portion to be bonded and to increase the wettability. Still further, when the solder powder is mixed with a soldering flux containing at least one material of which the OH group/molecular weight ratio (—OH/molecular weight×100%) is not less than 38%, it is possible to increase the reducibility of the paste and to secure the wettability.

The present invention will be illustrated more specifically by referring to the following Examples.

EXAMPLE 1

Figure 1B:
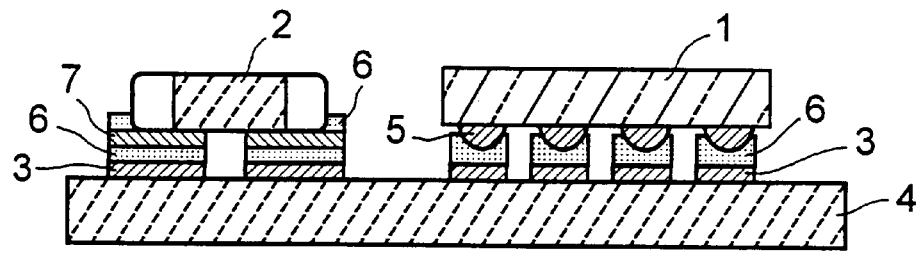
Figure 1C:
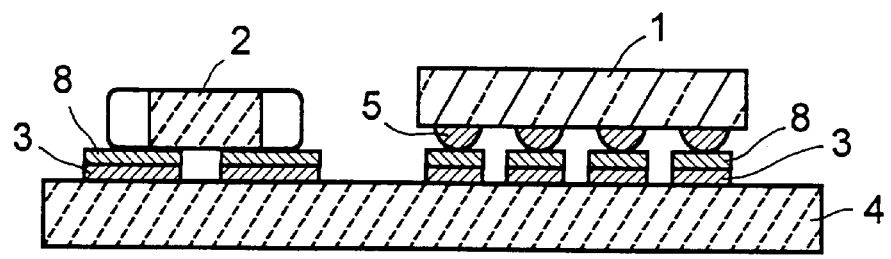

FIGS. 1A, 1B and 1C are each a schematic sectional view showing the soldering of a flip chip IC 1 and a chip component 2 on a substrate 4 and a substrate electrode 3 of a substrate 4. A solder 5 has been precoated on the substrate electrode 3 formed on the substrate 4. An organic substance 6 (for example, 100% of 1,2,6-hexanetriol) specified in the present invention is coated thereon. Then, the flip chip IC 1 and the chip component 2 are mounted thereon. In this state, the substrate 4 is passed through a reflow oven not shown to melt the solder, and the soldering is conducted as shown in FIG. 1A.

Figure 2:
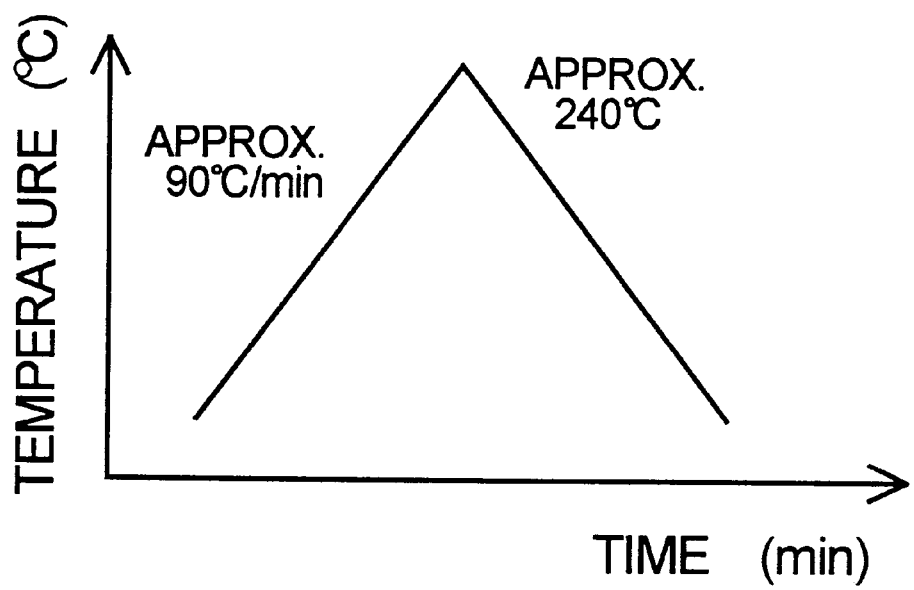
FIG. 2 is a schematic diagram showing a temperature profile in the reflow-soldering.

In the reflow-soldering, a hydrogen ($H_2$) gas or a nitrogen gas is used as an atmosphere of the oven. Or air is also available. This is because in the soldering of the present invention, the organic substance 6 specified is covered over the surroundings of the molten solder and even if the oxidation is conducted after the completion of the soldering, it does not influence the soldering per se. The temperature profile pattern in the reflow-soldering step may be an ordinary pattern, namely, room temperature→approximately from 235 to 250° C. (peak temperature)→room temperature, as shown in FIG. 2.

In this Example, the soldering is conducted in the atmosphere of the oven. It is also confirmed that the soldering can be conducted even on a hot plate in an air atmosphere.

In the minute investigation of the section of the resulting soldered portion, it is also confirmed through an electron microscope and an X-ray elemental analysis that the same soldering as that with the ordinary flux can be conducted in the present invention.

Figure 3:
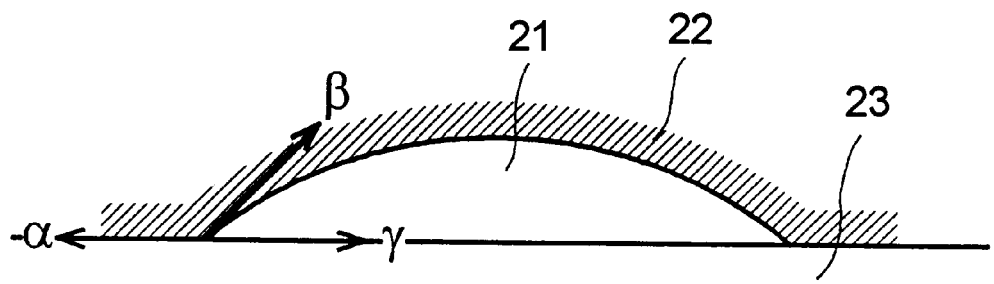
FIG. 3 is a view showing a wet state of a solder.

The soldering flux and flux for paste act as follows. As shown in FIG. 3, when the solder is melted, the flux covers an upper surface of the solder, whereby the solder is rapidly spread on a surface of an electrode in wet state. Otherwise, the solder becomes spherical on the surface of the electrode due to the surface tension. That is, it is necessary to realize the wet state in which the solder is rapidly spread in liquid state.

At that time, as shown in FIG. 3, the surface tension acts on an end of a liquid solder 21 on a substrate 23 such that the surface tension between the substrate and the flux acts in an α-direction, the surface tension between the liquid solder and the flux acts in a β-direction and the surface tension between the liquid solder and the substrate acts in a γ-direction. When the flux 22 which is liquid is covered on the surface of the molten solder, the surface tension in the β-direction is decreased, and the solder is spread on the substrate 23. It means that the flux acts to reduce the oxide film on the surface of the solder in melting the solder to increase the wet state of the solder. Accordingly, it is necessary that when the solder is melted, the flux in liquid state is spread over the surroundings of the solder.

As a material to realize such an action, the above-mentioned organic substances such as a rosin, a halogen compound and an organic acid were used so far. However, these substances as such or salts thereof are solids and cause the formation of the residue. The present inventors have studied materials that do not cause the formation of the residue, and have consequently specified the flux composed of the following organic materials.

According to the investigations of the present inventors, it has been found that a material composed of an organic substance of which the property (mass % at 180° C.) as measured by TG (in which a flow rate of an air or nitrogen gas atmosphere is 200 ml/min and a rate of temperature rise is 10° C./min) is more than a fixed value (at least 18%) is useful as a flux, and that the condition in which the mass % at 180° as measured by TG is at least 18% corresponds to approximately 95 mmHg of the steam pressure. Further, the paste has to be a substance which is hard to evaporate in melting the solder and that the steam pressure is less than 20 mmHg which is the steam pressure of glycerin.

Figure 4:
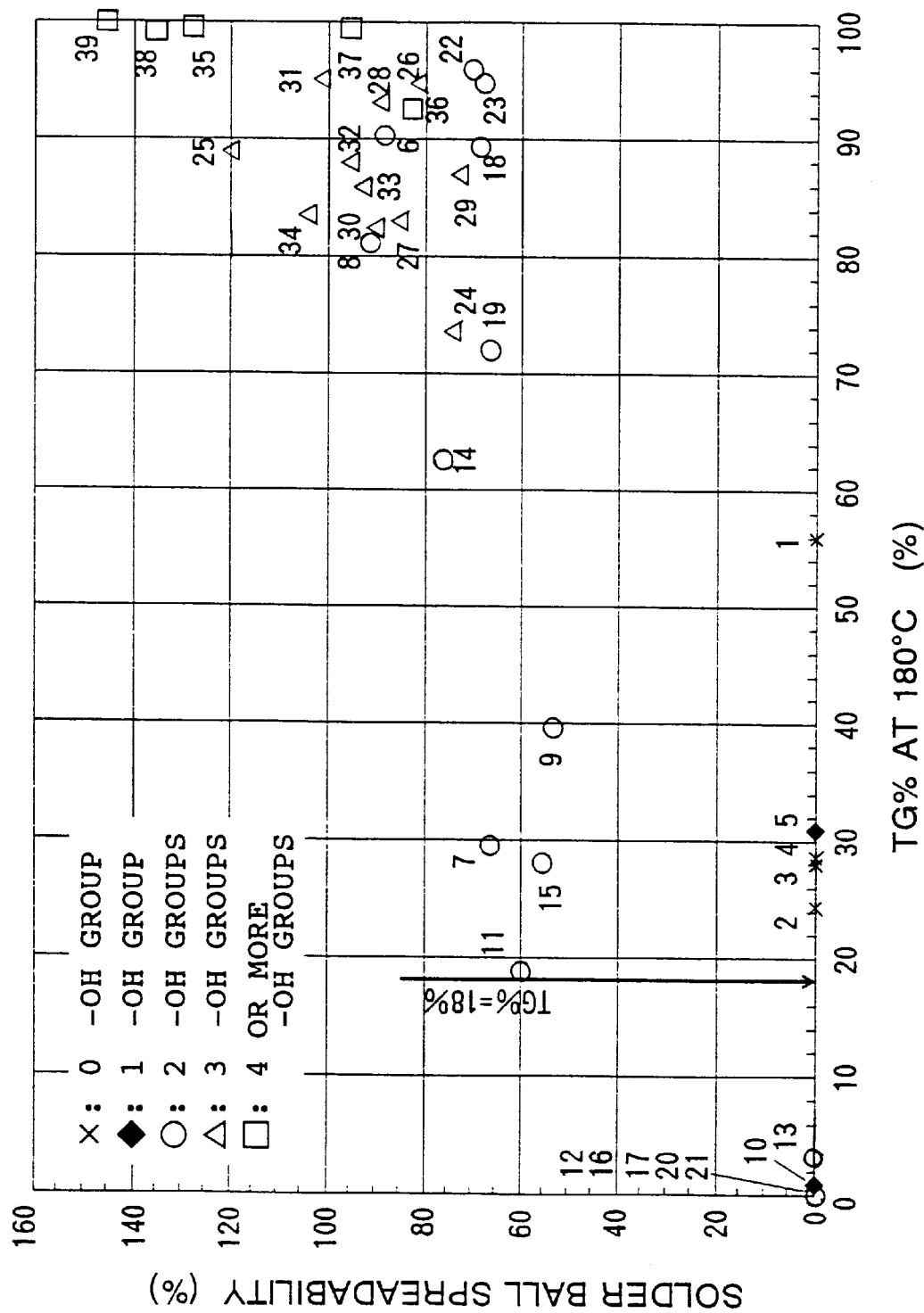
FIG. 4 is a graph showing a relationship between a solder wet spreadability of an organic substance and mass % according to TG at 180° C.

With respect to various organic substances used as a flux, the relationship between the solder spreadability and the TG property value (mass %) at 180° C. as measured by TG (in which a flow rate of a nitrogen gas atmosphere is 200 ml/min and a rate of temperature rise is 10° C./min) is shown in FIG. 4. The numbered materials and the solder spreadability and mass % data at 180° C. by TG of these materials are shown in Table 1.

TABLE 1

| No. | Materials | Solder Spread-ability (%) | TG % at 180° C. | Temperature with TG % = 0 |
|---|---|---|---|---|
| 1 | n-hexadecane | 0.0 | 56.1 | 203.5 |
| 2 | n-pentadecane | 0.0 | 24.5 | 189.4 |
| 3 | glycerin triacetate | 0.0 | 28.0 | 192.4 |
| 4 | ethyl cinnamate | 0.0 | 28.7 | 191.0 |
| 5 | n-dodecanol | 0.0 | 30.9 | 190.0 |
| 6 | 1,3-dioxane-5,5-dimethanol | 87.4 | 90.2 | 240.0 |
| 7 | 1,5-pentanediol | 65.6 | 29.7 | 190.8 |
| 8 | 2,5-furandimethanol | 90.4 | 81.0 | 240.0 |
| 9 | n-butyldiethanolamine | 53.3 | 39.7 | 193.8 |
| 10 | α-terpineol | 0.0 | 1.0 | 155.0 |
| 11 | ethyldiethanolamine | 60.1 | 18.5 | 187.0 |
| 12 | ethylene glycol | 0.0 | 0.0 | 156.6 |
| 13 | octylene glycol | 0.0 | 3.5 | 180.0 |
| 14 | diethanolamine | 76.6 | 62.3 | 206.6 |
| 15 | diethylene glycol | 54.9 | 28.0 | 192.4 |
| 16 | diethylene glycol monobutyl ether | 0.0 | 0.1 | 163.4 |
| 17 | dipropylene glycol | 0.0 | 0.2 | 172.3 |
| 18 | tetraethylene glycol | 68.4 | 89.5 | 240.1 |
| 19 | triethylene glycol | 65.5 | 71.7 | 216.5 |
| 20 | trimethylene glycol | 0.0 | 0.0 | 172.8 |
| 21 | propylene glycol | 0.0 | 0.0 | 146.8 |
| 22 | hexaethylene glycol | 69.4 | 96.0 | 263.2 |
| 23 | pentaethylene glycol | 67.5 | 95.0 | 260.0 |
| 24 | 1,2,3-hexanetriol | 74.2 | 73.8 | 209.4 |
| 25 | 1,2,4-butanetriol | 120.1 | 89.0 | 242.0 |

TABLE 1-continued

| No. | Materials | Solder Spread-ability (%) | TG % at 180° C. | Temperature with TG % = 0 |
|---|---|---|---|---|
| 26 | 1,2,6-hexanetriol | 81.5 | 94.7 | 251.8 |
| 27 | 2,3,4-trihydroxybenzophenone | 87.9 | 93.0 | 274.2 |
| 28 | 2',3',4'-trihydroxyacetophenone | 83.6 | 82.6 | 221.2 |
| 29 | 3-methylpentane-1,3,5-triol | 73.4 | 87.5 | 235.0 |
| 30 | glycerin | 88.8 | 82.4 | 232.3 |
| 31 | triethanolamine | 101.6 | 95.0 | 262.8 |
| 32 | trimethylolethane | 93.6 | 86.1 | 228.9 |
| 33 | trimethylolpropane | 96.3 | 88.4 | 229.0 |
| 34 | pyrogallol | 104.3 | 83.6 | 222.5 |
| 35 | erythritol | 127.6 | 99.8 | 282.4 |
| 36 | N,N-bis(2-hydroxyethyl)isopropanolamine | 82.8 | 92.6 | 243.6 |
| 37 | pentaerythritol | 96.4 | 99.6 | 341.9 |
| 38 | bis(2-hydroxymethyl)iminotris-(hydroxymethyl)methane | 135.9 | 93.3 | 400 or more |
| 39 | ribitol | 144.3 | 100.0 | 343.0 |

Figure 5A:
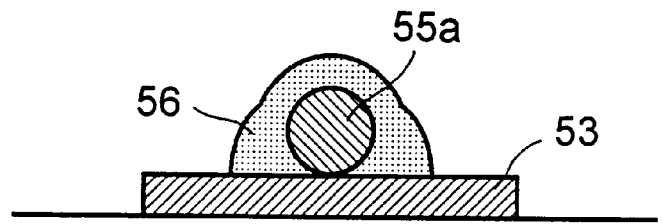
FIGS. 5A, 5B and 5C are each a view explaining the solder spreadability.
Figure 5B:
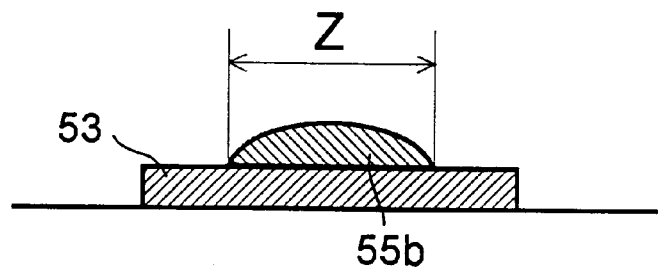
Figure 5C:
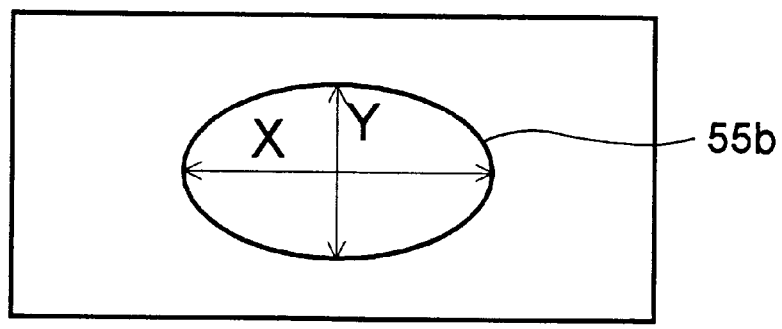

The solder spreadability shown in FIG. 4 is defined through the measurement shown in FIGS. 5A, 5B and 5C. That is, a solder ball 55a (containing 63% of Sn and a balance of Pb) having a diameter of 1 mm is mounted on a thick Cu conductor 53 together with an organic substance (solvent) 56 to be measured as shown in FIG. 5A, and is caused to reflow in a nitrogen atmosphere at a peak temperature of 235° C. as shown in FIG. 5B. As a result, the solder is spread. The spreadability (%) is determined on the basis of the average value Z of the diameter of the spread solder. As shown in FIG. 5C, the solder spreadability is not necessarily uniform. The average value Z of the spreadability [Z=(X+Y)/2] is calculated, and the spreadability is defined by the formula (Z−1)/1×100(%). As the diameter of the solder ball is 1 mm, the spreadability of 100% indicates that the diameter of the solder is increased to 2 mm.

TG % refers to the property of the material, and the TG is one thermal analysis by which evaporability of the material is precisely measured in terms of the mass.

The TG is a method in which a change in the mass of a sample is precisely determined by means of a differential thermal scale, and a mass of a substance which is hard to evaporate is precisely measured by the unit of 0.1 μg. This measurement, unlike the measurement of the boiling point, makes clear the evaporability (TG property) of the substance which is evaporated at up to the boiling point, and enables the classification which cannot be conducted through the usual measurement of the boiling point alone.

For example, as shown in FIG. 6, with respect to the TG property (the heating rate is 10° C./min and the flow rate of the atmosphere is 200 ml/min), octylene glycol [structural formula: $CH_3$—$(CH_2)_2$—$CH(OH)CH(C_2H_5)CH_2OH$, b.p.= 244° C.) and diethylene glycol [structural formula: HO—$(CH_2)_2$—O—$(CH_2)_2$—OH, b.p.=244° C.), both of which are organic materials having the same boiling point (b.p.) that are higher by 60° C. than the melting point of the eutectic solder, are used as flux and compared. In these cases, both of the materials start evaporation at a temperature of lower than the boiling point and complete the evaporation at a temperature of lower than the boiling point, and thus the boiled state does not occur.

The rate of the change in the mass of these materials during the evaporation is decreased with approximately the same curve. The temperatures of these materials when the mass thereof becomes 50% are approximately 160° C. and 185° C. as shown in FIG. 6. Since the melting point of the solder is approximately 180° C., octylene glycol is already completely evaporated when the solder starts melting, and it does not act as a flux. Accordingly, the soldering is actually impossible. Meanwhile, with respect to diethylene glycol, the solder is melted during the evaporation, and the surface tension of the solder is decreased to cause the solder to flow well and make the solder wet. When the soldering is completed, triethylene glycol is completely evaporated, and no residue remains. That is, the organic material (solvent) has to be surely present in liquid state in a region A in which the solder starts wetting as shown in FIG. 6.

Thus, polyhydric alcohols containing two —OH groups and having approximately the same boiling point are divided into a material which becomes wet and a material which does not become wet, as measured by the solder ball test. Examples thereof are shown in Table 2.

With respect to the materials having wettability as shown in Table 2, the boiling points of these materials are different by some degrees centigrade, whereas the evaporation temperatures (mass %=approximately 0%) thereof are different by approximately several tens of degrees centigrade. Further, it is not that the higher the boiling point the higher the evaporation temperature. For example, the boiling point of ethyldiethanolamine is higher than that of 1,5-pentanediol, but the evaporation temperature of the former is lower than that of the latter. As is apparent from the comparison between these materials, the evaporation temperatures thereof are measured through the TG, and whether the solder ball becomes wet or not can be judged depending on whether the evaporation temperature is higher or lower than the melting point of the solder.

TABLE 2

| Materials | b.p. (° C.) | Evaporation temperature (° C.) | Wettability |
| --- | --- | --- | --- |
| 1,5-pentanediol | 243 | 190.8 | good |
| diethylene glycol | 244 | 192.4 | good |
| ethyldiethanol-amine | 247 | 187.0 | good |
| octylene glycol | 244 | 180.0 | not good |
| dipropylene glycol | 232 | 172.3 | not good |

TABLE 3

| Materials | b.p. (° C.) | Evaporation temperature (° C.) | Number of —OH groups | Solder spreadability (%) |
| --- | --- | --- | --- | --- |
| 1,5-pentanediol | 243 | 190.8 | 2 | 65.60 |
| diethylene glycol | 244 | 192.4 | 2 | 54.90 |
| ethyldi-ethanol-amine | 247 | 187.0 | 2 | 60.05 |
| n-dodecanol | 257 | 190.0 | 1 | 0 |
| ethyl cinnamate | 271 | 191.0 | 0 | 0 |
| n-buthyldi-ethanol-amine | 276 | 193.8 | 2 | 53.25 |

The evaporation temperature cannot be anticipated from the boiling point for the following reason as well. That is, Table 3 indicates the properties of the materials of which the evaporation temperatures are approximately 190° C. The boiling points of these materials are between 243° C. and 276° C. and are different by 30° C. or more. Thus, it means that the evaporation temperatures cannot be anticipated from the boiling points. Further, Table 3 reveals that even if the evaporation temperatures are higher than the melting point of the solder, some materials do not show wettability at times because of the number of the —OH group.

That is, availability of the material as a flux cannot be simply judged based on the boiling point.

Thus, it is found that not the boiling point but the TG property is a standard by which to specify the material. Since the TG property is related with the evaporation, it also corresponds to the steam pressure. Since the steam pressure depends on the temperature, it is advisable that the standard temperature be a temperature at which to melt the solder. Thus, when the organic substance is used as a flux, this organic substance may be judged not from the boiling point but from the data obtained through the TG.

Accordingly, on the basis of the TG property shown in FIG. 6, organic substances are compared with respect to the amount of the residue (mass %) at 180° C. and the solder spreadability defined in FIGS. 5A to 5C when the organic substances are used as a soldering flux, as shown in FIG. 4. As a result, it proves that a great many organic substances are useful as a soldering flux.

As shown in FIG. 4, the organic materials having only one —OH group exhibit the solder spreadability of 0%, which means that the soldering is impossible.

Table 3 shows the properties of the materials of which the evaporation temperatures are approximately 190° C. (higher than the melting point of the eutectic solder). From Table 3, the materials are compared with respect to the number of the —OH groups. That is, the materials having two —OH groups become all wet, but the material having 1 or 0 —OH group does not at all become wet.

That is, the organic material which exhibits weak or no reducibility to the solder surface and the substrate (surface of the substrate electrode) is not effective as a flux. In the organic materials having two —OH groups, the solder is spread with the TG property of at least 18%, and the soldering can be conducted.

Further, in all of the organic materials having three —OH groups (mainly polyhydric alcohols), the solder spreadability exceeds 70%, and the TG property exceeds 80%. The organic materials having four —OH groups (mainly saccharides) exhibit the low steam pressure and can be used as a soldering paste. These materials are hard to evaporate, and therefore can be easily used as a soldering paste.

Thus, as shown in FIG. 4, the classification of the organic materials regarding the temperatures is enabled which is different from the classification according to the boiling point (b.p.). The availability of the organic materials as a flux can precisely be estimated from this classification. It is found through this classification that a large number of the organic materials can be used as a flux.

Figure 7:
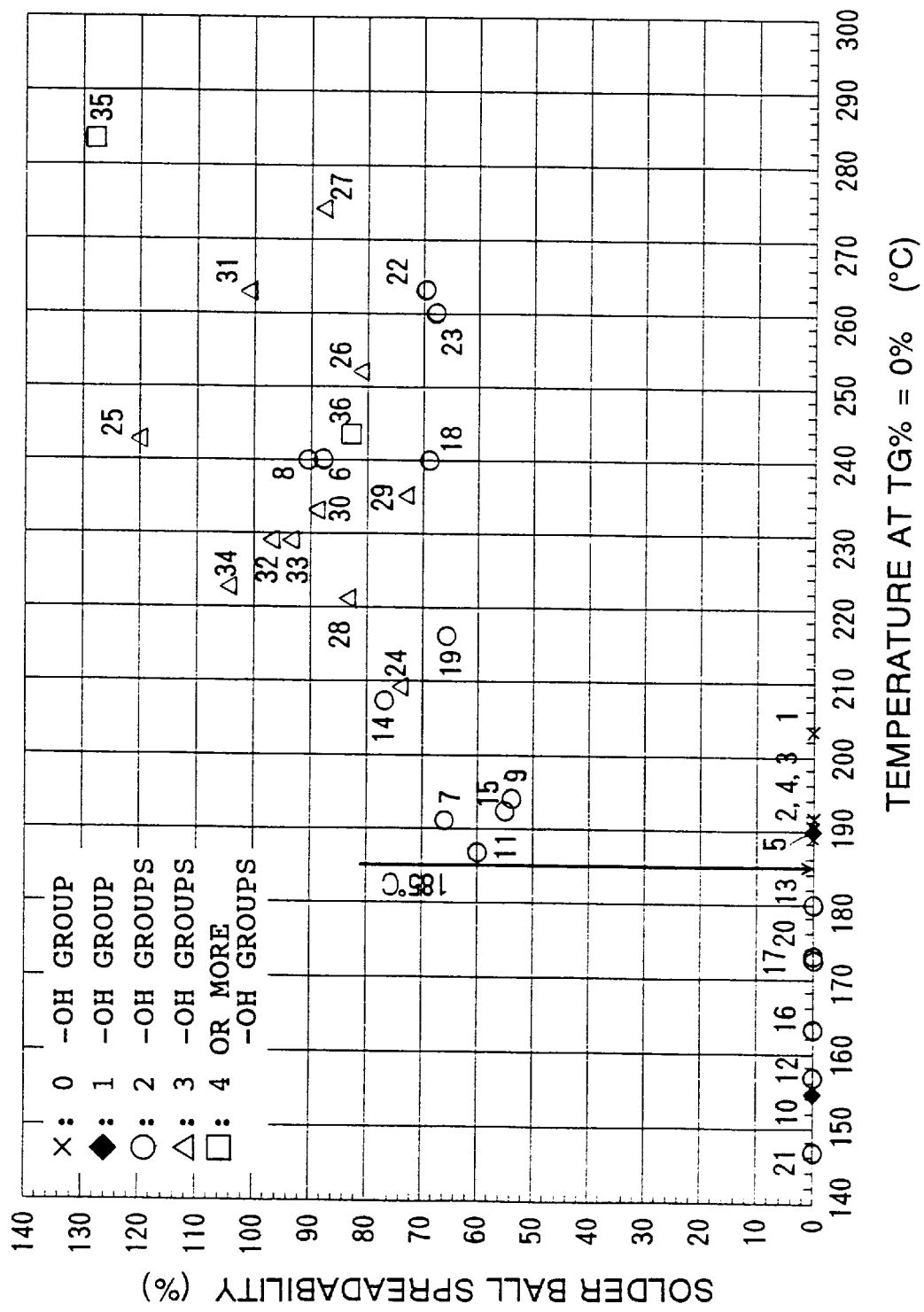
FIG. 7 is a graph showing a relationship between the solder wet spreadability of the organic substance and the temperature (evaporation temperature) when the mass % according to TG is approximately 0%.
Figure 8:
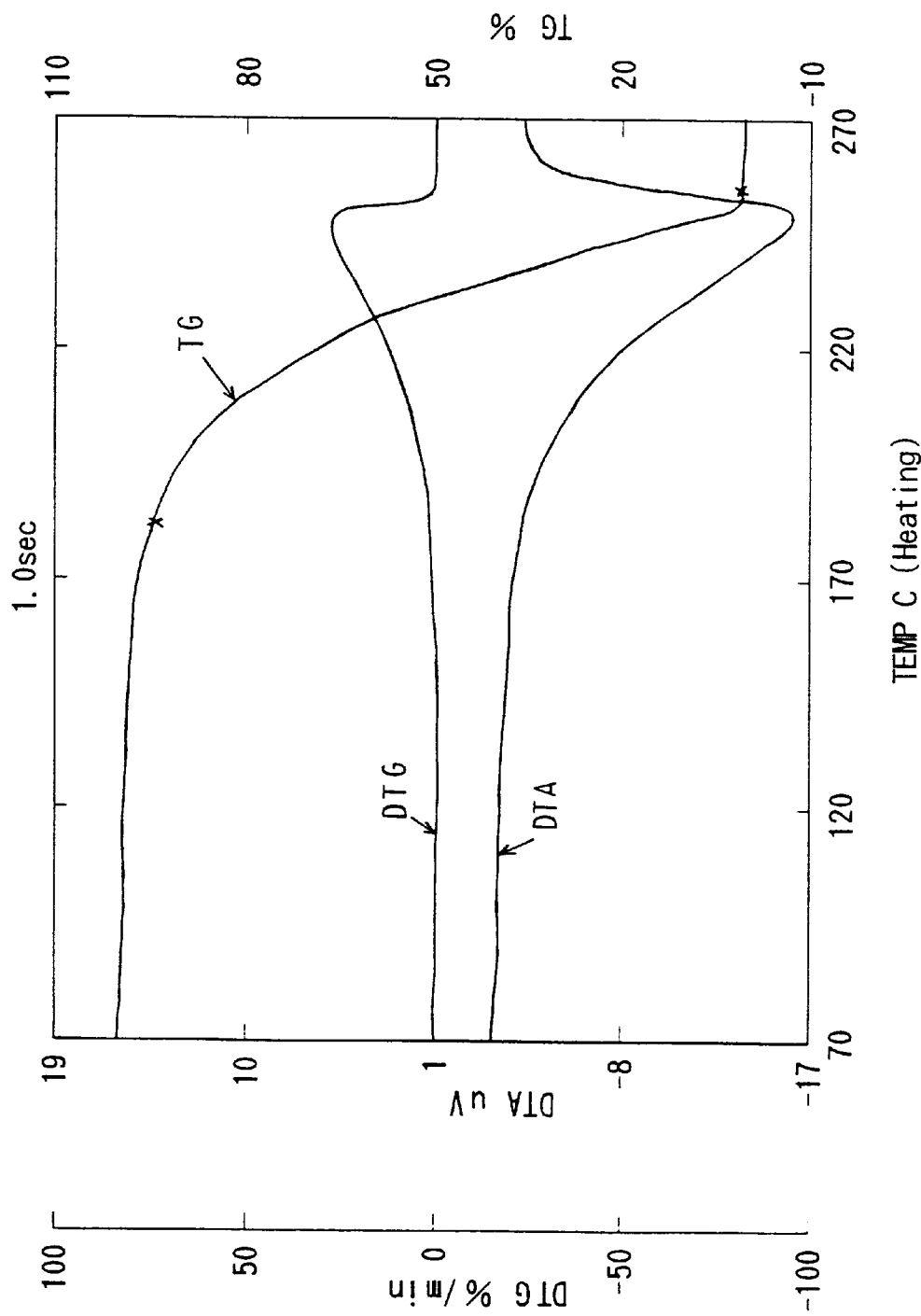
FIG. 8 is a graph showing properties of 1,2,6-hexanetriol according to thermal gravimetry.
Figure 9:
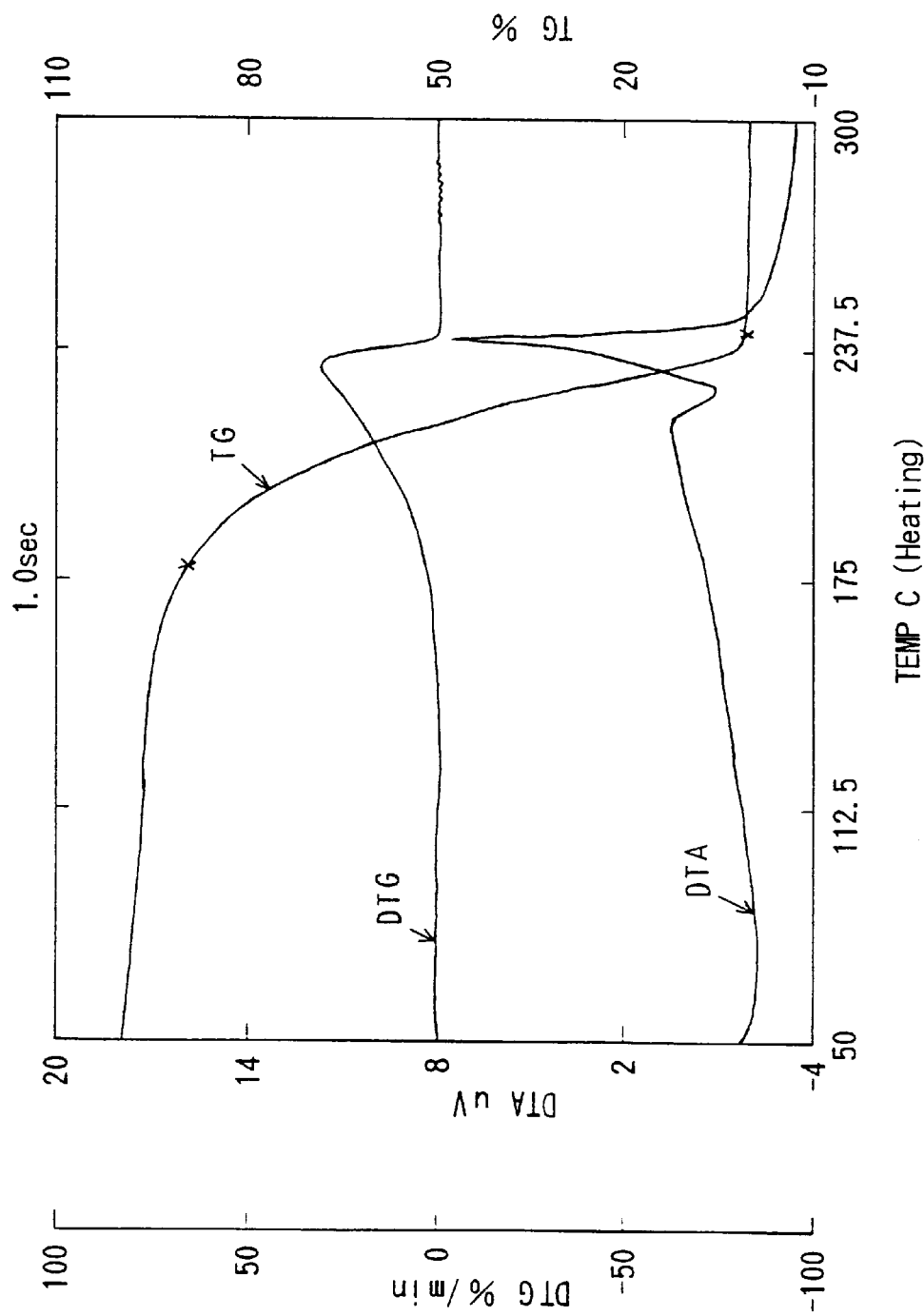
FIG. 9 is a graph showing properties of tetraethylene glycol according to thermal gravimetry.
Figure 10:
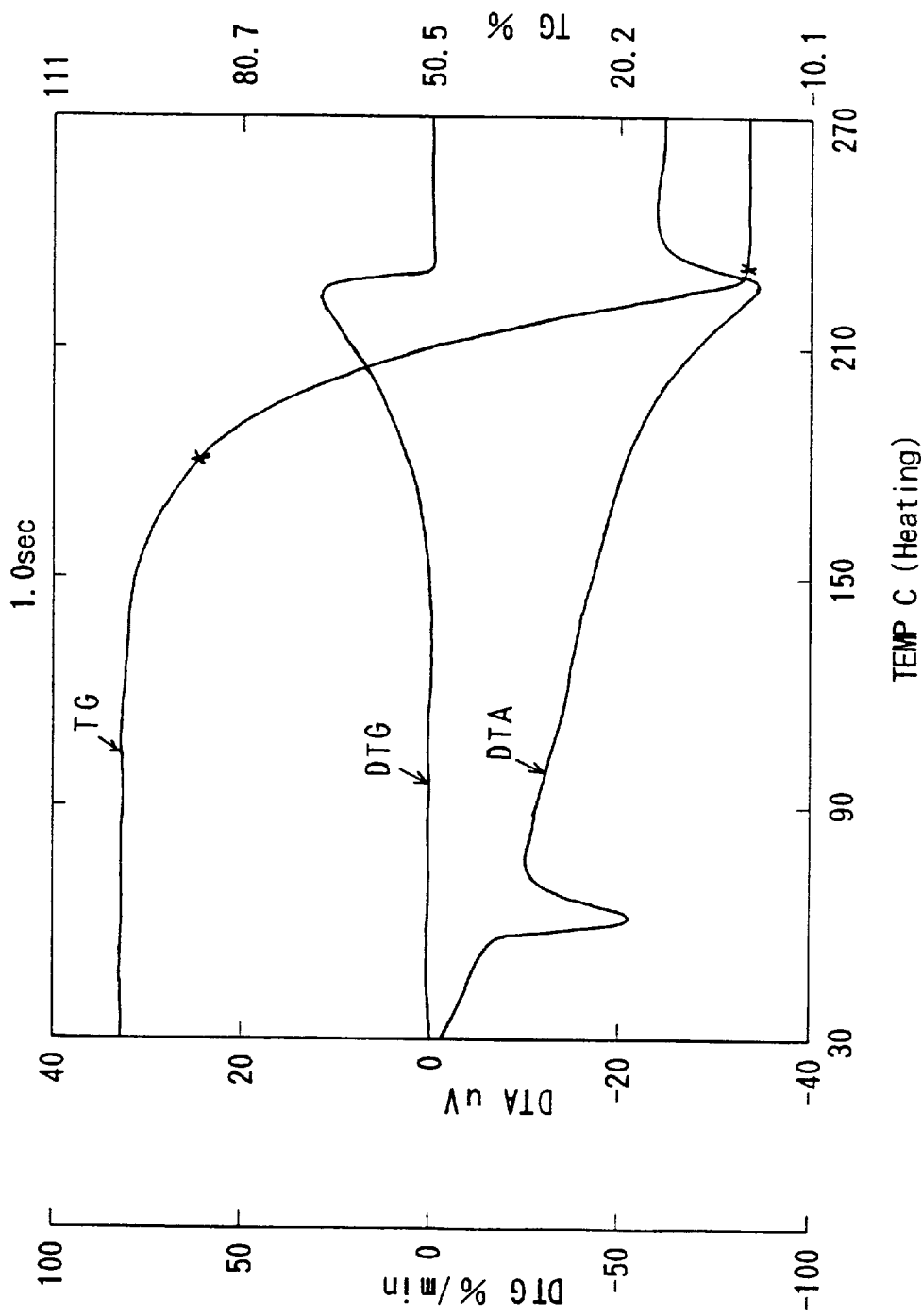
FIG. 10 is a graph showing properties of trimethylolpropane according to thermal gravimetry.
Figure 11:
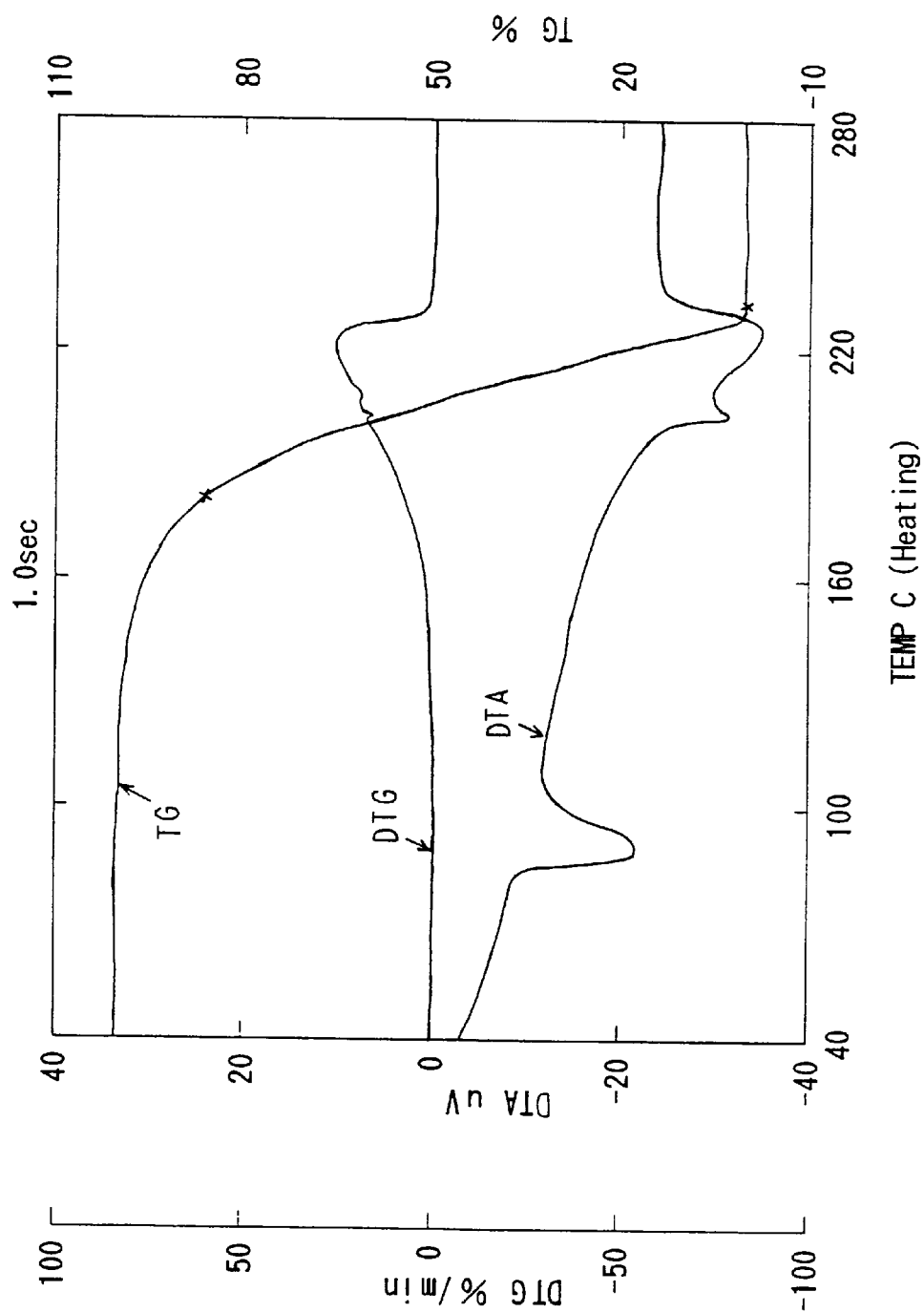
FIG. 11 is a graph showing properties of trimethylolethane according to thermal gravimetry.
Figure 12:
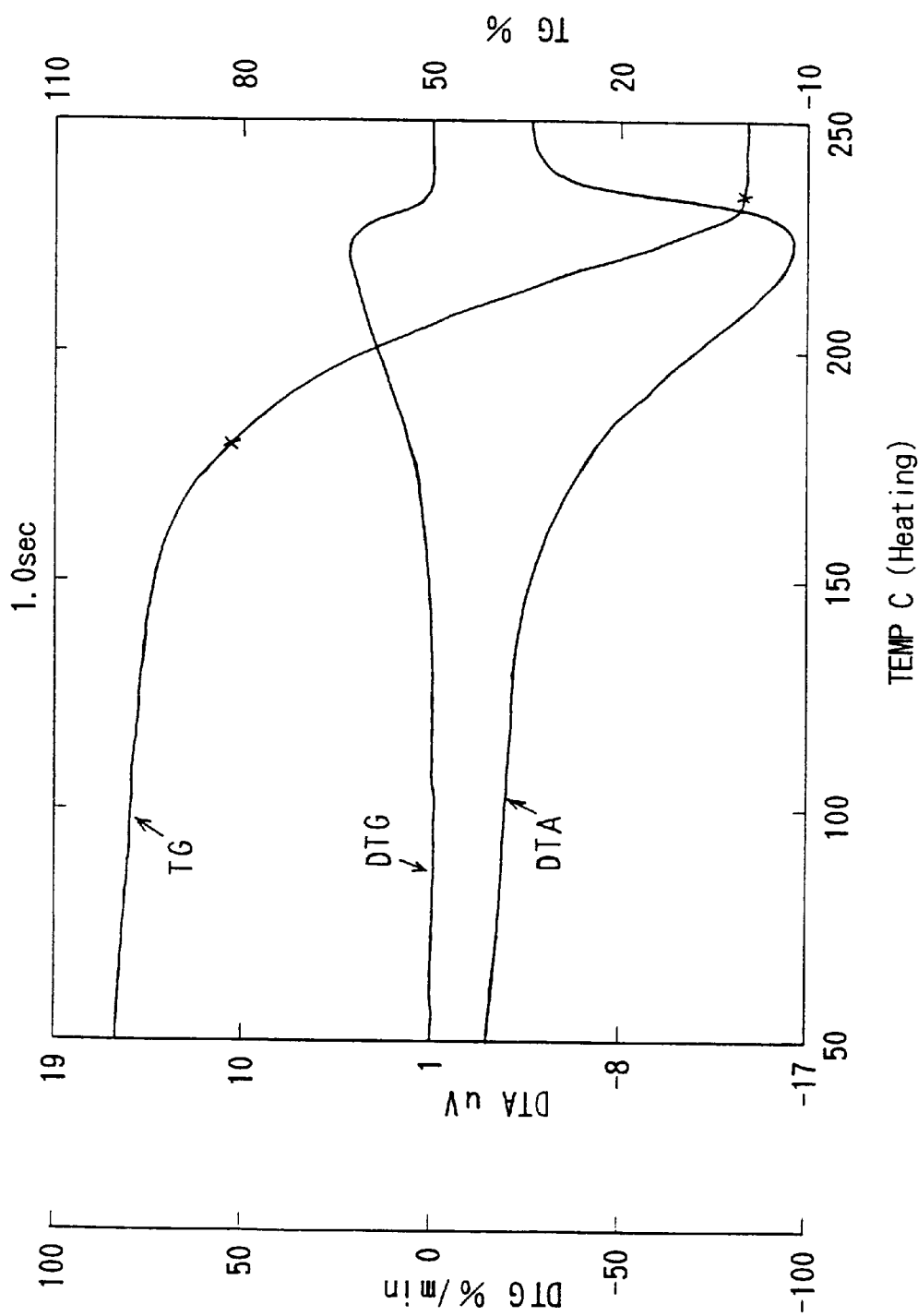
FIG. 12 is a graph showing properties of glycerin according to thermal gravimetry.

The solder spreadability is also related with the temperature at which the mass % measured by TG becomes 0% (evaporation temperature). FIG. 7 shows a relationship between the solder spreadability and the temperature at which the mass % is 0% (evaporation temperature), as measured by TG in which a flow rate of a nitrogen gas atmosphere is 200 ml/min and a rate of temperature rise is 10° C./min. From FIG. 7, it can be understood that a material having at least two —OH groups in a molecule and having the evaporation temperature of not lower than 185° C. may be selected to wet-spread the solder.

The numbered materials in FIG. 7 and the solder spreadability and the mass % at 180° C. by TG and the temperature with the mass %=approximately 0% thereof are minutely shown in Table 1.

The change in the mass % measured by TG with respect to typical ones of the materials shown in FIG. 7 and Table 1, namely, 1,2,6-hexanetriol (No. 24 in FIG. 7), tetraethylene glycol (No. 18 in FIG. 7), trimethylolpropane (No. 33 in FIG. 7), trimethylolethane (No. 32 in FIG. 7) and glycerin (No. 30 in FIG. 7) is shown in FIGS. 8, 9, 10, 11 and 12. In these graphs, TG indicates mass %, DTG indicates the change in TG, and DTA indicates endotherm.

As shown in FIGS. 8 to 12, as the temperature increases, TG % decreases, and finally becomes 0% which means that the material is completely evaporated. The data of the materials are collected using the temperature at this time as the evaporation temperature. Table 1 is obtained on the basis of these data, and FIG. 7 is obtained on the basis of Table 1. The present inventors have obtained a lot of data other than the data shown in FIG. 1, and the list of the other data is shown in Table 4.

Tables 5 and 6 show the organic substances of which the solder spreadability is great in the soldering to allow the excellent soldering, together with those shown in FIG. 4. Table 5 shows the distilled substances which can singly have the properties of the present invention, and Table 6 shows the undistilled substances which can singly have the properties of the present invention. In Tables 5 and 6, "Presence of the residue by TG" indicates whether or not the mass % measured by TG becomes approximately 0%. Further, "Steam pressure at 180° C." is a value described in a document, and an estimated value undescribed in a document is written in parentheses.

With respect to 1,2,4-butanetriol and 3-methylpentane-1,3,5-triol among the commercially available organic substances shown in Table 5, a trace amount of the residue remains as measured by TG. When these substances are distilled and used, almost no residue is observed.

TABLE 4

| Materials | Solder spreadability (%) | TG % at 180° C. | Temperature with TG % = 0 |
|---|---|---|---|
| n-hexadecane | 0 | 56.1 | 203.5 |
| n-pentadecane | 0 | 24.5 | 189.4 |
| o-toluidine | 0 | | |
| oleic acid | 109.5 | 98.2 | *300 |
| capric acid | 79.7 | 45.4 | 195.5 |
| glycerin diacetate | 0 | | |
| glycerin triacetate | 0 | 28 | 192.4 |
| ethyl cinnamate | 0 | 28.7 | 191 |
| dibutyl oxalate | 0 | | |
| tetralin | 0 | | |
| trimethylacetic acid | 0 | | |
| tri-n-butyl phosphate | 0 | | |
| lactic acid | 161 | 23 | *240 |
| n-decanol | 0 | | |
| n-dodecanol | 0 | 30.9 | 190 |
| benzyl alcohol | 0 | | |
| 1,3-dioxane-5,5-dimethanol | 87.4 | 90.2 | 240 |
| 1,3-butanediol | 0 | | |
| 1,4-dioxane-2,3-diol | 21.1 | 67.3 | 220 |
| 1,5-pentanediol | 65.6 | 29.7 | 190.8 |
| 2,5-furandimethanol | 90.4 | 81 | 240 |
| n-butyldiethanolamine | 53.3 | 39.7 | 193.8 |

TABLE 4-continued

| α-terpineol | 0 | 1 | 155 |
|---|---|---|---|
| ethyldiethanolamine | 60.1 | 18.5 | 187 |
| ethylene glycol | 0 | 0 | 156.6 |
| octylene glycol | 0 | 3.5 | 180 |
| diethanolamine | 76.6 | 62.3 | 206.6 |
| diethylene glycol | 54.9 | 28 | 192.4 |
| diethylene glycol monobutyl ether | 0 | 0.1 | 163.4 |
| dipropylene glycol | 0 | 0.2 | 172.3 |
| tetraethylene glycol | 68.4 | 89.5 | 240.1 |
| triethylene glycol | 65.5 | 71.7 | 216.5 |
| trimethylene glycol | 0 | 0 | 172.8 |
| propylene glycol | 0 | 0 | 146.8 |
| hexaethylene glycol | 69.4 | 96 | 263.2 |
| pentaethylene glycol | 67.5 | 95 | 260 |
| 1,2,3-hexanetriol | 74.2 | 73.8 | 209.4 |
| 1,2,4-butanetriol | 120.1 | 89 | 242 |
| 1,2,6-hexanetriol | 81.5 | 94.7 | 251.8 |
| 2,3,4-trihydroxybenzophenone | 87.9 | 93 | 274.2 |
| 2',3',4'-trihydroxyacetophenone | 83.6 | 82.6 | 221.2 |
| 3-methylpentane-1,3,5-triol | 73.4 | 87.5 | 235 |
| glycerin | 88.8 | 82.4 | 232.3 |
| triethanolamine | 101.6 | 95 | 262.8 |
| trimethylolethane | 93.6 | 86.1 | 228.9 |
| trimethylolpropane | 96.3 | 88.4 | 229 |
| pyrogallol | 104.3 | 83.6 | 222.5 |
| D(+)-arabitol | 101.9 | | |
| D-ribose | 127.4 | | |
| N,N-bis(2-hydroxyethyl)isopropanolamine | 82.8 | 92.6 | 243.6 |
| erythritol | 127.6 | 99.8 | 282.4 |
| pentaerithritol | 96.4 | 99.6 | 341.9 |
| D(+)-glucose | 84.1 | | |
| bis(2-hydroxymethyl)iminotris-(hydroxymethyl)methane | 135.9 | 99.3 | 400 or more |
| ribitol | 144.3 | 100 | 343 |

| Materials | Steam pressure at 180° C. | b.p. (° C.) | m.p. (° C.) | Number of OH | residue level |
|---|---|---|---|---|---|
| n-hexadecane | | | | 0 | 0 |
| n-pentadecane | | | | 0 | 0 |
| o-toluidine | | 200.4 | | 0 | 0 |
| oleic acid | | 360 | | 0 | 2 |
| capric acid | | 239.3 | | 0 | 0 |
| glycerin diacetate | | 260 | | 0 | 0 |
| glycerin triacetate | | 259 | | 0 | 0 |
| ethyl cinnamate | | 271 | | 0 | 1 |
| dibutyl oxalate | | 245.5 | | 0 | 0 |
| tetralin | | 207.6 | | 0 | 0 |
| trimethylacetic acid | | 163.8 | | 0 | 0 |
| tri-n-butyl phosphate | | 289 | | 0 | 0 |
| lactic acid | | 190 | | 0 | 2 |
| n-decanol | 225 | 232.9 | | 1 | 0 |
| n-dodecanol | 60 | 257 | | 1 | 0 |
| benzyl alcohol | 880 | 205.3 | | 1 | 0 |
| 1,3-dioxane-5,5-dimethanol | | | | 2 | 0 |
| 1,3-butanediol | 340 | 207.4 | | 2 | 0 |
| 1,4-dioxane-2,3-diol | | | | 2 | 0 |
| 1,5-pentanediol | | 242.5 | | 2 | 0 |
| 2,5-furandimethanol | | | 75 | 2 | 1 |
| n-butyldiethanolamine | 80 | 276 | | 2 | 0 |
| α-terpineol | | 221 | | 2 | 1 |
| ethyldiethanolamine | | 247 | | 2 | 0 |
| ethylene glycol | | 197.9 | | 2 | 0 |
| octylene glycol | 95 | 244.2 | | 2 | 0 |
| diethanolamine | 80 | 268 | | 2 | 0 |
| diethylene glycol | 90 | 244.3 | | 2 | 0 |
| diethylene glycol monobutyl ether | 180 | 230.4 | | 2 | 0 |
| dipropylene glycol | 150 | 231.8 | | 2 | 1 |
| tetraethylene glycol | 7 | 327.3 | | 2 | 0 |
| triethylene glycol | 25 | 249 | | 2 | 0 |
| trimethylene glycol | | 210.5 | | 2 | 0 |
| propylene glycol | 590 | 188.2 | | 2 | 0 |
| hexaethylene glycol | 217/4 mmHg | | | 2 | 0 |
| pentaethylene glycol | 184/2 mmHg | | | 2 | 0 |
| 1,2,3-hexanetriol | | | 68 | 3 | 0 |

TABLE 4-continued

| | | | | |
|---|---|---|---|---|
| 1,2,4-butanetriol | 190/18 mmHg | | 3 | 1 |
| 1,2,6-hexanetriol | 178/5 mmg | | 3 | 0 |
| 2,3,4-trihydroxybenzophenone | | 197.5 | 3 | 1 |
| 2',3',4'-trihydroxyacetophenone | | 170 | 3 | 1 |
| 3-methylpentane-1,3,5-triol | | | 3 | 1 |
| glycerin | 20 | 290 | 3 | 0 |
| triethanolamine | 15 | 360 | 3 | 0 |
| trimethylolethane | (206° C.) | 283 | 200 | 3 | 0 |
| trimethylolpropane | | 292 | 58 | 3 | 0 |
| pyrogallol | | 133.5 | 3 | 0 |
| D(+)-arabitol | | | 4 | 2 |
| D-ribose | | | 4 | 2 |
| N,N-bis(2-hydroxyethyl)-isopropanolamine | 145/.6 mmHg | | 4 | 0 |
| erythritol | | | 4 | 0 |
| pentaerithritol | | | 4 | 0 |
| D(+)-glucose | | | 5 | 2 |
| bis(2-hydroxymethyl)-iminotris-(hydroxymethyl)methane | | 104 | 5 | 0 |
| ribitol | | | 5 | 0 |

*Minimum TG %
Residue Level 0: no residue, 1: small amount, 2: unacceptable

TABLE 5

| Organic substances | b.p. (° C.) | Steam pressure at 180° C. (mmHg) | Solder spreadability (%) (solder ball test) | Presence of residue by TG |
|---|---|---|---|---|
| diethylene glycol | 243.3 | ~90 | large: 55% small: 0% | No |
| triethylene glycol | 249 | ~25 | 65% | No |
| tetraethylene glycol | 327.3 | ~7 | 68% | No |
| trimethylene glycol | 210 to 211 | (~100) | 10% or less | No |
| 1,5-pentadiol | 242.5 | (~80) | large: 66% small: 0% | No |
| glycerin | 290 | ~20 | 89% | No |
| 1,2,6-hexanetriol | 178 (5 mmHg) | (20 or less) | 82% | No |
| 1,2,4-butanetriol | 190 (18 mmHg) | | 120% | trace (0.5%) |
| 3-methylpentane-1,3,5-triol | | | 73% | 0.50% |
| trimethylolpropane | 292 (b.p) 56 to 59 (m.p.) | ~20 | 96% | No |
| trimethylolethane | 283 (b.p.) 199 to 201 (m.p.) | ~20 | 94% | No |
| D-ribose | 87 (m.p.) | (20 or less) | 127% | brown residue* |
| ribitol | 102 to 104 (m.p.) | (20 or less) | 144% | No |
| D(+)-glucose | 146 (m.p.) | (20 or less) | 84% | brown residue* |
| D(+)-arabitol | | (20 or less) | 102% | brown residue* |
| erythritol | 118 to 120 (m.p.) | (20 or less) | 120% | No |
| diethanolamine | 268 | (~80) | 77% | No |
| triethanolamine | 360 | 15(206° C.) | 102% | No |

TABLE 5-continued

| Organic substances | b.p. (° C.) | Steam pressure at 180° C. (mmHg) | Solder spreadability (%) (solder ball test) | Presence of residue by TG |
|---|---|---|---|---|
| ethyldiethanolamine | 246 to 248 | 3(117.8° C.) | 60% | No |
| n-butyldiethanolamine | 262 to 290 | (~80) | 53% | No |

*Wettability is good: amount of the residue is unacceptable

TABLE 6

| Organic substances | b.p. (° C.) or m.p. (° C.) | Steam pressure at 180° C. (mmHg) | Solder spreadability (%) (solder ball test) | Presence of residue by TG |
|---|---|---|---|---|
| 1,2,3-hexanetriol | 67 to 69 (m.p.) | — | 74 | NO |
| 2,2-bis(hydroxymethyl)-2,2',2"-nitriloethanol [bis(2-hydroxyethyl)-iminotris(hydroxymethyl)methane] | 104 (m.p.) | — | 136 | YES |
| 1-[N,N-bis(2-hydroxyethyl)amino]-2-propanol [N,N-bis(2-hydroxyethyl)-isopropanolamine] | 145 (b.p.) (0.6 mmHg) | — | 82.8 | NO |
| pyrogallol | 133 to 134 (m.p.) | — | 104 | NO |
| 2,5-furandimethanol | 74 to 76 (m.p.) | — | 90 | YES |
| 2',3',4'-trihydroxyacetophenone | 169 to 172 (m.p.) | — | 84 | NO |
| 2,3,4-trihydroxybenzophenone | 197 to 198 (m.p.) | — | 88 | NO |
| 1,3-dioxane-5,5-dimethanol | 58 to 60 (m.p.) | — | 87 | NO |
| pentaethylene glycol | 184 (2 mmHg) | — | 67.5 | NO |
| hexaethylene glycol | 217 (4 mmHg) | — | 69.4 | NO |

Besides, the organic substances shown in Tables 5 and 6 may be mixed so long as these are not reacted with each other. The reason is that the respective organic substances act sufficiently as a flux at various temperatures and in various periods depending on the steam pressure or TG property thereof during the melting of the solder.

There are a large number of organic substances having the properties of the present invention which are not shown in Tables 5 and 6, and these are available as a flux and a paste. Accordingly, it is possible to provide a lot of soldering methods in which no residue remains and which obviates the washing in the post-treatment. Especially, materials free from the conventional organic substances having the carbonyl group or containing halogen compounds are still effective as a flux or a paste. Thus, the range of the application is broadened.

Table 7 shows the organic substances which do not fall under the present invention and which have the solder spreadability of 0% as shown in the lowest abscissa axis of FIG. 4. It is confirmed that the soldering is impossible with these organic substances.

The conditions of TG which are used to classify the organic substances are for specifying the organic substances as a flux, and not those which are employed in the actual process. In the actual process, the organic substances which meet the actual conditions may be used.

TABLE 7

| Organic substances | b.p. (° C.) | Steam pressure at 180° C. (mmHg) | Solder spreadability (%) <solder ball test> |
|---|---|---|---|
| n-decanol | 232.9 | 225 | 0% |
| n-dodecanol | 255~259 | 60 | |
| benzylalcohol | 205.3 | ~880 | |
| tri-n-butyl phosphate | 289 | 50(196° C.) | |
| o-toluidine | 200.4 | 50(150° C.) | |
| triaminobenzene | | 25 | |
| tetralin | 207.6 | 400 | |
| liquid paraffin | ≧300° C. | (≦20) | |
| acetophenone | 202.1 | 400 | |
| ethyl cinnamate | 271 | ≦100 | |
| dibutyl oxalate | 245.5 | 20(50° C.) | |
| octylene glycol | 244 | | |
| diethylene glycol monobutyl ether | 230.4 | ~180 | |
| dipropylene glycol | 231.8 | ~150 | |
| ethylene glycol | 197.3 | ~400 | |

The environment in the measurement through TG in the present invention is approximately the same as the environment in which reflow-soldering is conducted in a 4-zone nitrogen reflow oven with a temperature profile of from 160 to 170° C. for approximately 1 minute at a rate of temperature rise of approximately 90° C./min. This is confirmed from the observation of the amount of the material evaporated.

In the above-mentioned description, an eutectic solder (containing approximately 63% of Sn and a balance of Pb) having a melting point of approximately 180° C. is used. It is also confirmed that the soldering can be carried out under the same conditions using a solder (containing, for example, from approximately 18 to 97.5% of Sn and a balance of Pb) having a solid phase linear temperature of approximately 180° C. The above-mentioned solder is the Sn-Pb-type solder (containing additives such as Ag, In, Cu, Bi, Sb and the like). However, with respect to other low-temperature solders such as a Bi-type solder, an In-type solder and the like, the solder ball test is conducted using solders having melting points of 130° C., 139° C. and 165° C. These materials do not exhibit reducibility at the melting points thereof, and start wetting at approximately 170° C. This is clearly seen from the fact that the oxide film cannot be removed at a temperature of from 165 to 170° C. or higher (refer to FIG. 19).

Accordingly, with respect to the conditions of the soldering flux, the mass % measured by TG at the solder melting point of not lower than 170° C. is at least 18%, the number of —OH groups in a molecule is at least 2, and the liquefaction is conducted in the soldering; the temperature at which the mass % measured by TG becomes approximately 0% (evaporation temperature) is not lower than 170° C. and not lower than the solder melting point, and the number of —OH groups in a molecule is at least 2.

Further, the soldering can be conducted with the high-temperature solder containing 10% of Sn and a balance of Pb and further approximately 10 g of erythritol dissolved in approximately 5 g of tetraethylene glycol.

The substrate electrode is composed of at least one of the solder, Sn, Cu, Ag, Ni, Au, Pt, Pd, alloys thereof and a thick film conductor. Almost all of ordinary electrode materials can be applied thereto.

EXAMPLE 2

The solder plating is conducted in Example 1. It is also confirmed that the same soldering effect can be obtained by a method in which a soldering pellet (solder foil) 7 is formed and coated together with a specific flux 6 (refer to FIG. 1B).

That is, tetraethylene glycol (100%) has been coated as a solvent on a land (substrate electrode) on which a chip component is to be mounted by means of a dispenser. Then, the solder foil (pellet) 7 having approximately the same size as the land is placed on the solvent 6, and the chip component 2 is mounted thereon. In a flip chip IC portion, a solder bump 5 has been formed on the flip chip IC, with the result that it is unnecessary to place the solder foil. The resulting substrate 4 is passed through a reflow oven to conduct soldering.

The above-mentioned coating is conducted by means of the dispenser, but it may be conducted through the printing. It is further confirmed that the solvent is completely evaporated after the reflow-soldering by the coating on the land only or by the coating throughout the substrate. In the order of the coating, the flux may be coated after the solder foil is mounted.

The reflow-soldering may be conducted in air or in an inert atmosphere. Either the soldering in the oven or the reflow-soldering on a hot plate will do.

In this Example 2, tetraethylene glycol is used as a flux. However, when using the other organic substances shown in Tables 5 and 6 of Example 1, the soldering of the present invention can be carried out.

EXAMPLE 3

The soldering is conducted using a soldering paste 8 (refer to FIG. 1C). The soldering paste is obtained by mixing a solder powder with a solvent as a paste. A creamy paste is coated on a soldering region. Since the solder powder increases the surface area of the solder, a higher level of reducibility is required in melting the solder. Accordingly, when the organic substance of the present invention is used as a solvent of a soldering paste, it is necessary that the organic substance contains three —OH groups. Besides, the organic substance has to be liquid.

In order to obtain the paste in a half-kneaded state, the solvent in an amount of approximately 10% by weight has to be contained in the solder. That is, compared with the above-mentioned Examples, the amount of the solvent which acts in the flux is small, and the solvent is evaporated rapidly in the same temperature profile. Accordingly, even though the solvent has a high level of reducibility, it is meaningless if the solvent is not present in the soldering. Therefore, the substance having a small steam pressure is suitable as a paste. Actually, glycerin of which the mass % measured by TG is approximately 82% and the steam pressure at 180° C. is approximately 20 mmHg is not available as a paste.

A paste that actually gives excellent results is as follows. For example, 100 g of a solder powder containing 62% of Sn, 2% of Ag and a balance of Pb (JIS H62Ag2) and having a particle size of from 25 to 40 μm are mixed with approximately 9% by weight of 1,2,6-hexanetriol (polyhydric alcohol) as a solvent, and the mixture is kneaded well. Since this solvent has a high viscosity of 2,584 cps at room temperature, a paste capable of printing through a metal mask or a mesh mask can be formed without adjusting the viscosity. This soldering paste is printed on a substrate through a metal mask or a mesh mask, and a chip component and a flip chip IC are then mounted thereon. The resulting substrate is passed through a reflow oven to conduct the soldering.

EXAMPLE 4

Trimethylolpropane (approximately 12.3 g) which is solid at room temperature is milled well using a mortar, and dissolved in approximately 6.2 g of tetraethylene glycol as a solvent. The mixture is stirred well to form a gel. To this are added 138.9 g of a solder powder containing 62% of Sn, 2% of Ag and a balance of Pb and having a particle size of from 25 to 40 μm, and the mixture is kneaded well. The resulting mixture is used as a soldering paste, and subjected to the printing step and to the soldering in a reflow oven as in Example 3. In this Example 4, the two specific organic substances are mixed to exhibit the reducibility and the liquid state (wettability), and the paste is therefore easy to use.

The components of the soldering paste of which the preferable solder wettability has been confirmed by the experiment are as follows.
1. 1,2,6-hexanetriol alone
2. triethanolamine alone
3. mixture of tetraethylene glycol and trimethylolpropane
4. mixture of diethanolamine genus, tetraethylene glycol and 1,2,6-hexatriol glycerin
5. mixture of a solvent shown in Tables 5 and 6 and triethanolamine in an amount of from 0.045% to 100%
6. mixture of 1,2,6-hexatriol and trimethylolpropane
7. mixture of trimethylolpropane, water and tetraethylene glycol These substances exhibit the same viscosity as the commercially available soldering paste in an amount of from approximately 8 to 12% by weight based on the soldering paste.

In the pastes described in Examples 3 and 4, no residue occurs, and formation of a solder ball is suppressed. This is because the material is completely free from a resin, so that the remaining solder ball that is formed owing to the irregular temperature rise is absorbed in melting the solder and is not left after the completion of the soldering. This is confirmed by comparatively observing the pastes in Examples 3 and 4 with the commercially available paste through a high-temperature microscope.

EXAMPLE 5

The present inventors described a method of producing a protruded electrode using a flux in Japanese Laid-Open Patent Application No. 64-5039. The organic substances specified in the present invention can also be applied thereto.

Figure 13:
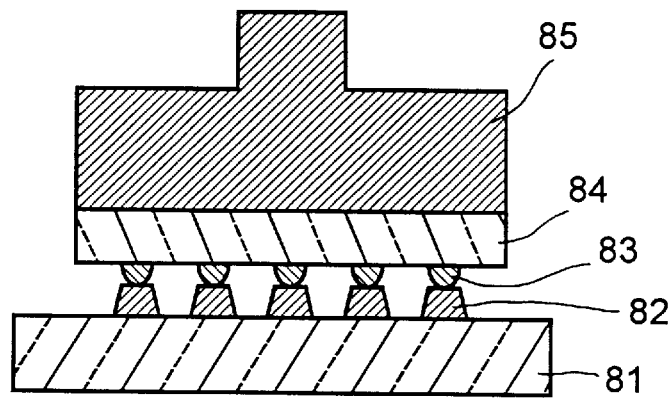
FIG. 13 is a schematic sectional view showing the structure in Example 5.

For example, as shown in a schematic sectional view of FIG. 13, land portions 82 are formed at a pitch of 200 μm on a transfer substrate 81 through the solder-plating in the same manner as electrodes 83 of a flip chip IC 84. Titanium and copper are continuously deposited on an Al wire electrode at the IC 84 side as a barrier electrode after the formation of a passivation film, and a copper electrode is then plated thereon. The resulting flip chip IC 84 is adsorbed by means of a chip mounter 85. For example, tetraethylene glycol as a solvent is transferred thereon by means of a tray having a thickness of approximately 30 μm. The thus-obtained flip chip IC 84 is positioned within a jig by means of a positioning device and is moved to the transfer substrate 81. While the IC chip 84 is heated to approximately 240° C., this IC chip is lowered and brought in contact with the solder on the transfer substrate 81 to conduct the transfer. The solvent is evaporated from the thus-transferred solder electrode 83, enabling the transfer without washing and with no residue left.

EXAMPLE 6

The application to an HIC substrate for vehicles is demonstrated in this Example. A flip chip IC and a chip component are mounted on a HIC ceramic substrate formed of a copper conductor and having the minimum electrode distance of 100 μm. For example, the flux or paste described in the above-mentioned Examples is coated or printed on an electrode portion. A chip component and a flip chip IC are mounted thereon by means of a mounter. Then, the resulting substrate is passed through an nitrogen oven to conduct the reflow-soldering. In the reflow-soldering, a temperature profile pattern is used in which the substrate is kept at a temperature of approximately 160° C. for 1 minute and the peak temperature is approximately 235° C. A rate of temperature rise is approximately 60° C./min.

After the completion of the soldering, wire bonding is conducted. At this time, it is confirmed that the unwashed product exhibits the same bondability as the conventional washed product and keeps a tensile strength, that the thus-obtained product is free from leakage and has the same properties as the conventional product, and that no residue is visually observed in the vicinity of the soldered portion and no peak ascribable to the organic substance is observed through the Fourier transformation-infrared (FT-IR) analysis (that is, no flux component is observed).

EXAMPLE 7

A small amount of an organic acid of which the mass % measured by TG at approximately 240° C. is approximately 0% is added to the flux component free from an organic acid and a halogen compound. Since the organic acid is reacted with a metallic oxide to form a salt, it does not happen that no residue remains. However, when the mass % measured by TG is approximately 0%, the organic acid itself is evaporated or thermally decomposed, the soldering can be conducted even if a small amount of the residue remains. Therefore, the organic acid that is thermally decomposed or evaporated is added to the flux material shown in the above-mentioned Examples.

For example, approximately 1% by weight of capric acid [$CH_3$—$(CH_2)_6$—COOH], a monocarboxylic acid which is almost completely evaporated at 200° C. as analyzed by TG is added to the flux material shown in Tables 5 and 6. The mixture is soldered in the reflow-soldering step. The thus-obtained flux further increases the wettability. It is found that especially the paste exhibits the excellent wettability.

In the substance which can be added to the flux of the present invention, the mass % measured by TG at approximately the peak temperature has to be approximately 0%. When using a carboxylic acid such as lactic acid or oleic acid, the mass % measured by TG does not become approximately 0%, and the residue remains in an amount of from scores of micrograms to several milligrams. Thus, the resulting product cannot be used. Besides the above-mentioned carboxylic acid, adipic acid of which the mass % measured by TG at approximately 240° C. becomes approximately 0% is also available.

EXAMPLE 8

Figure 14A:
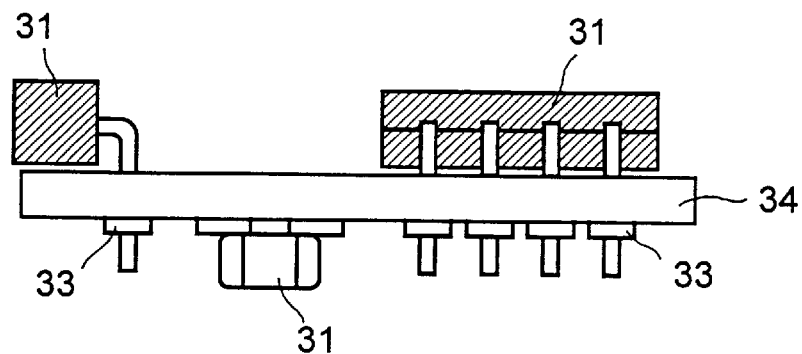
FIGS. 14A and 14B are each a schematic sectional view showing the flow-soldering.
Figure 14B:
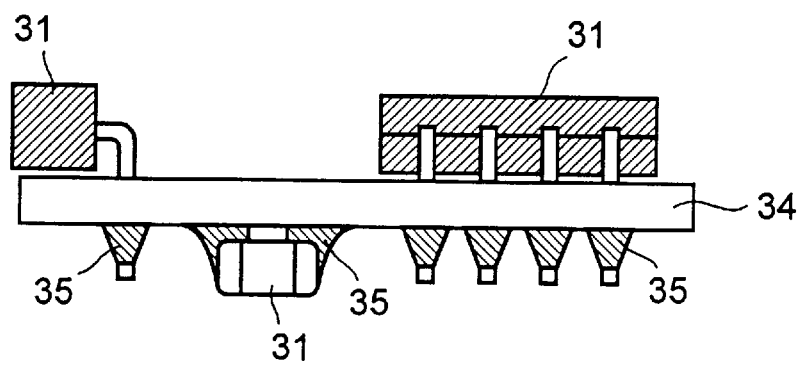

In the above-mentioned Examples, the reflow-soldering is conducted. However, the flow-soldering also gives the same flux effect. The flow-soldering of a circuit component 31 on a substrate wire 33 of a substrate 34 is shown in FIGS. 14A and 14B. In this case, the jet-soldering is conducted. After the circuit component 31 such as a shrink-type IC or a chip component is temporarily mounted on the substrate 34, a flux (glycerin among the organic substances shown in Tables 5 and 6) is coated on the overall surface of the print substrate 34 from the reverse surface thereof. The substrate 34 is preheated at approximately 150° C., passed through a jet-soldering bath, brought into contact with the molten solder at approximately 240° C., and then dried by means of a fan. No residue of the flux is observed on the thus-flow-soldered print circuit, and the same effects (reduction and improvement in wettability) as given in the reflow-soldering are brought forth.

EXAMPLE 9

Approximately 200 g of a solder powder containing 62% of Sn, 2% of Ag and a balance of Pb and having a particle size of from 25 to 40 $\mu$m are mixed with, for example, approximately 8 g of a rosin and approximately 15 g of 1,2,6-hexanetriol, and these are kneaded well to form a paste. The print circuit is subjected to the printing in the same manner as in Example 3 using this paste.

In the thus-soldered product, only the resin component slightly remains as a residue, but the other ingredients are decomposed and evaporated, enabling the excellent soldering. That is, the soldering that exceeds the soldering by which a small amount of the flux remains can be conducted using the materials of this Example instead of the activator and solvent of the commercial paste. In this case, the good solderability can be obtained in comparison with the case of not using the resin.

In this Example, the rosin is used as the resin. The same results can be given using an acrylic resin other than the rosin. Further, 1,2,6-hexanetriol is used here as the component other than the resin. A mixture of tetraethylene glycol and butyl carbitol or α-terpineol that dissolves the rosin may be used instead.

EXAMPLE 10

For example, approximately 12.5 g of trimethylolpropane which has been crushed well in an agate pot are added to approximately 15.3 g of tetraethylene glycol and dissolved therein while slightly elevating the temperature. Trimethylolpropane is not completely melted, but can be coated well in this state.

This solvent is coated on a substrate to which a solder containing 60% of Sn and a balance of Pb has been applied, and a chip component and a flip chip IC with bumps containing 40% of Sn and a balance of Pb and having a pitch of 400 $\mu$m are mounted thereon. Then, the reflow-soldering is conducted using a belt reflow oven in an inert atmosphere. In the usual profile in which the peak temperature is approximately 240° C. as shown in FIG. 2, the solvent is completely evaporated after the completion of the soldering, and no residue of the solvent remains which is confirmed through scanning electron microscopy (SEM) and FT-IR analysis.

Tetraethylene glycol which is a dihydric alcohol has a viscosity that is not so high at room temperature. However, when trimethylolpropane that is solid at room temperature is added thereto, the viscosity increases, and thixotropic properties are obtained, thereby improving retention of the product.

Thus, the polyhydric alcohol which is solid at room temperature is available as a thixotropic agent. Other examples of the polyhydric alcohol that is solid at room temperature include trimethylolethane and 1,2,3-hexanetriol. These alcohols are also available as a thixotropic agent.

The mixing ratio of the solvent and the solid is approximately 1:1 in this Example. When the amount of trimethylolpropane is increased, the same bondability can be obtained. Tetraethylene glycol alone is also effective as shown in Example 2, but the mixture of it with trimethylolpropane exhibits stronger reducibility and can allow the better soldering.

EXAMPLE 11

Approximately 12.6 g of trimethylolethane which has been crushed well in an agate pot are dissolved in approximately 9.7 g of tetraethylene glycol. This trimethylolethane is not completely dissolved but formed into an opaque white jelly liquid.

This liquid is mixed with a eutectic solder powder containing 60% of Sn and a balance of Pb and having a particle size of from 25 to 40 $\mu$m by means of a spatula, and the mixture is then kneaded well by means of a revolving kneader for approximately 30 minutes.

The thus-obtained paste can be used in the printing. The printing is conducted on a ceramic substrate for measuring insulation resistance using this paste. Opposite electrodes formed of a thick copper film at pitches of 100 $\mu$m, 200 $\mu$m and 300 $\mu$m are mounted on this substrate, whereby insulation resistance can be measured after the reflow-soldering.

The reflow-soldering is conducted using a belt reflow oven in a nitrogen atmosphere. Trimethylolethane has a melting point of 200° C. According to TG, sublimation occurs remarkably at approximately 150° C., and reducibility is exhibited before the solder is melted, showing excellent wettability. A pressure cooker bias test (PCBT) is then conducted for approximately 120 hours under such severe conditions that the temperature is 121° C., the humidity is 85%, and a voltage applied to the opposite electrode is 24V.

The same test is conducted using a mixture of tetraethylene glycol with 1,2,6-hexanetriol, triethanolamine or triethylolpropane.

Figure 15:
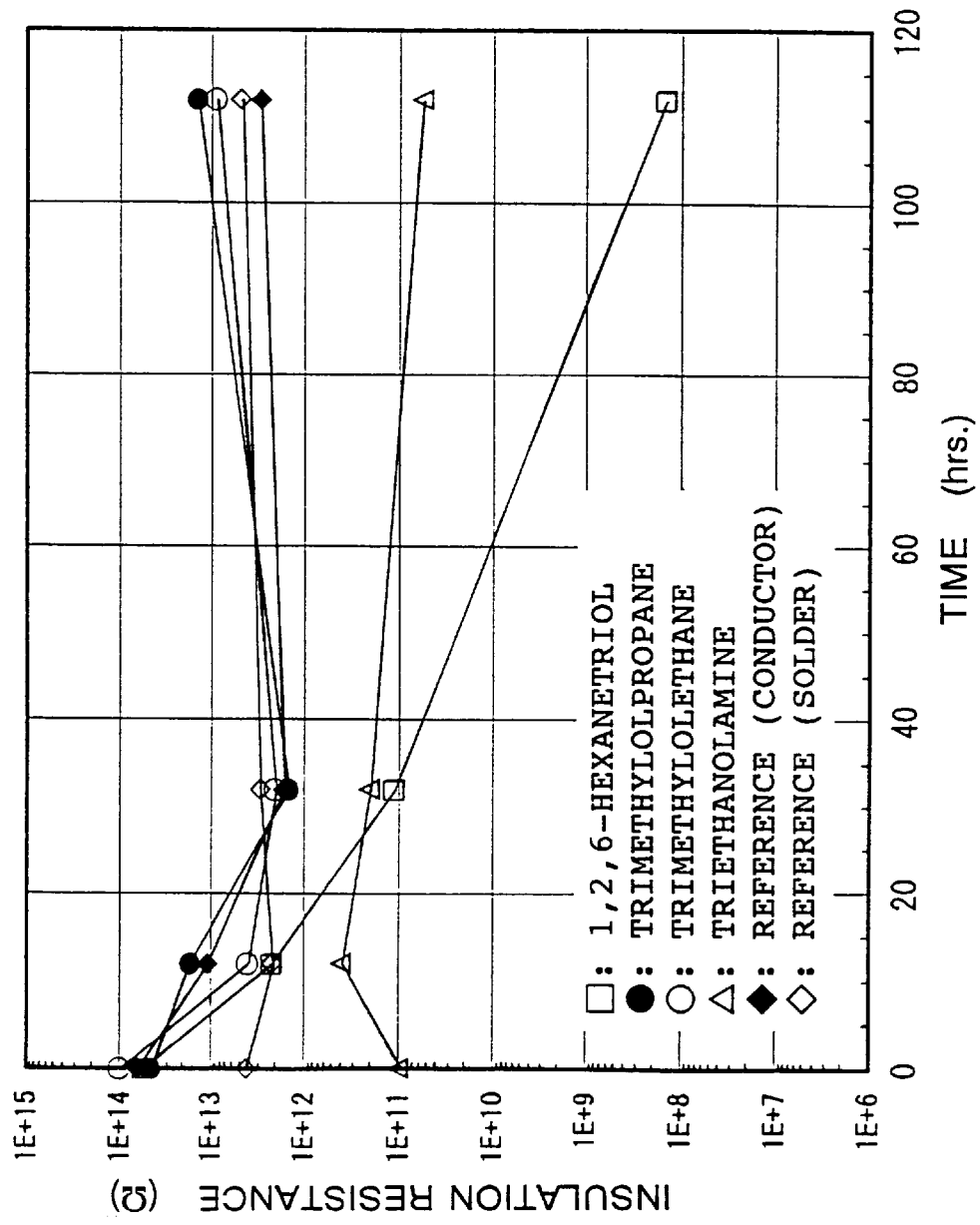
FIG. 15 is a graph showing PCBT test results of a paste.
Figure 16:
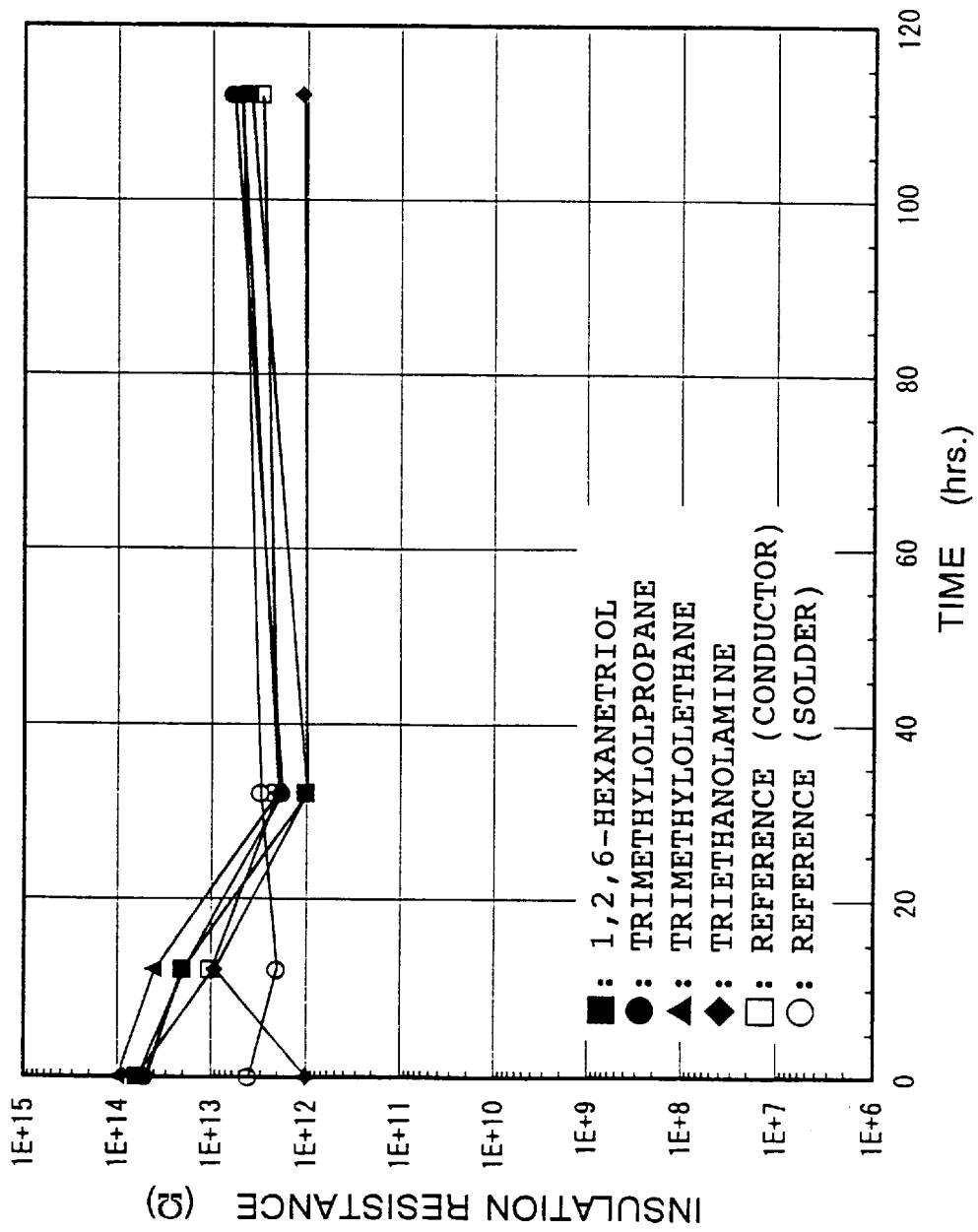
FIG. 16 is a graph showing PCBT test results of a flux.

With respect to the soldering of the flux, the solder is fed to the substrate electrode through dipping. After the substrate electrode is washed well, 1,2,6-hexanetriol or the like is coated thereon, and the resulting product is subjected to the reflow-soldering. The thus-obtained sample is also subjected to PCBT. The results of the paste is shown in FIG. 15, and those of the flux is shown in FIG. 16.

The state of the paste of trimethylolpropane or trimethylolethane or the flux is almost the same as the initial state in the severe test. Accordingly, these materials and the soldering method are said to be preferably applied to the use in vehicles in a strict environment.

Especially, in the paste, the substances other than trimethylolpropane and trimethylolethane decreases the insulation resistance. This is ascribable to the structures of the substances. That is, first, the substances are free from an amine group. Second, the substances do not contain adjacent —OH groups in a molecule. The substances that satisfy these two conditions can allow the better soldering.

The structural formulas of 1,2,6-hexanetriol, trimethylolpropane and trimethylolethane are as follows.

[Structural Formula of 1,2,6-hexanetriol]

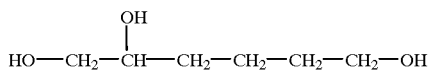

[Structural Formula of trimethylolpropane]

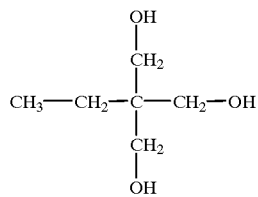

[Structural Formula of trimethylolethane]

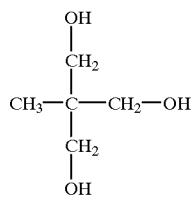

1,2,6-Hexanetriol has adjacent —OH groups, but trimethylolpropane or trimethylolethane is free from adjacent —OH groups, and at least three carbon atoms are present between the —OH groups.

When the adjacent —OH groups are present in the structure, the solvent is easily oxidized, and the alcohol group is changed to the carbonyl group in the oxidized portion to form an Sn salt or the like, decreasing the reliability. This can easily be imagined from fragment ions of a spectrum according to mass spectrometry (MS).

That is, a relatively strong fragment peak of carbonyl or aldehyde which seems ascribable to adjacent —OH groups is observed in the spectrum of 1,2,6-hexanetriol according to MS, while no such strong fragment peak is observed in the spectrum of trimethylolpropane or trimethylolethane. It means that 1,2,6-hexanetriol causes oxidation in a molecule more easily, and forms a metal salt in a paste which is often brought into contact with tin oxide (Sn ion), lowering the reliability in the severe test.

Meanwhile, triethanolamine is structurally similar to trimethylolpropane. This substance having the amine group is excellent in terms of the wettability, but is easy to oxidize like 1,2,6-hexanetriol, and the reliability thereof is the same as that of 1,2,6-hexanetriol.

EXAMPLE 12

Approximately 200 g of a solder powder containing 62% of Sn, 2% of Ag and a balance of Pb and having a particle size of from 25 to 40 $\mu$m are mixed with approximately 9.7 g of tetraethylene glycol and approximately 24.6 g of trimethylolpropane. These are mixed by means of a spatula, and the mixture is then kneaded well by means of a revolving kneader.

In the same manner as in Example 3, the paste is coated, and the resulting product is reflow-soldered in an oven of a nitrogen atmosphere. The reflow-soldering profile at this time is shown in FIG. 17.

Figure 17:
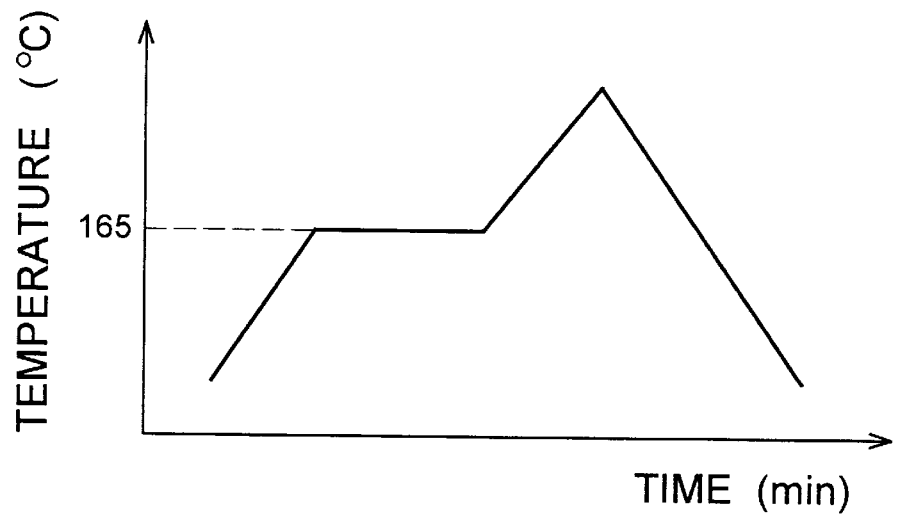
FIG. 17 is a schematic diagram showing a temperature profile in the reflow-soldering.

As shown in FIG. 17, the product is retained at a temperature of approximately 165° C. for 1 minute, and a rate of temperature rise is approximately 90° C./min.

Thus, the better solderability can be obtained by retaining the product at approximately 170° C. The temperature at which to retain the product can be determined on the basis of a temperature at which methylolpropane starts exhibiting reducibility to the electrode material (refer to FIG. 19).

Figure 18:
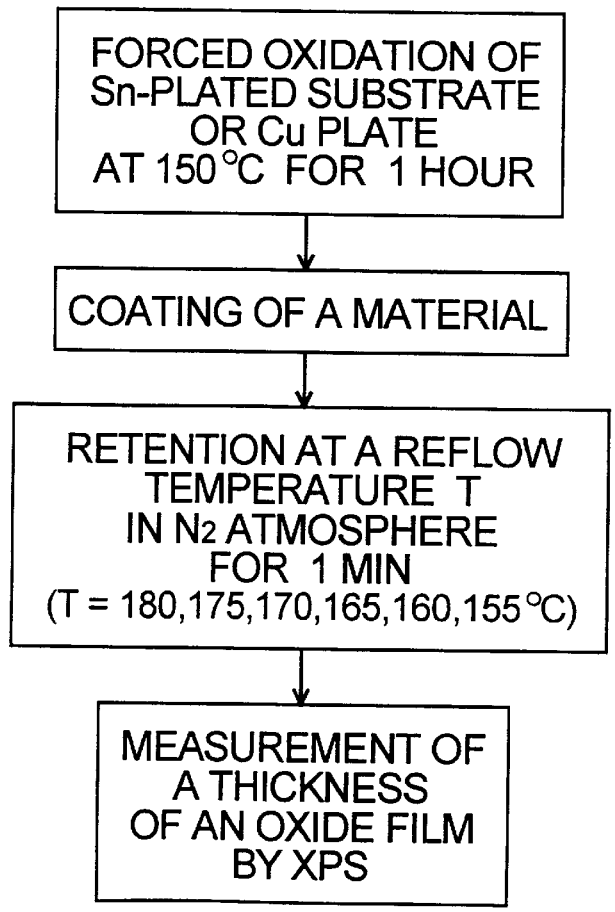
FIG. 18 is a flow chart of a method of measuring ability to remove a copper oxide film.

FIG. 18 is a flow chart of a method of measuring ability to remove an oxide film in which a material is coated on a copper oxide or tin oxide substrate, the resulting substrate is reflow-soldered, and the thickness of the oxide film on the thus-obtained sample is measured through X-ray photoelectron spectroscopy (XPS).

Figure 19:
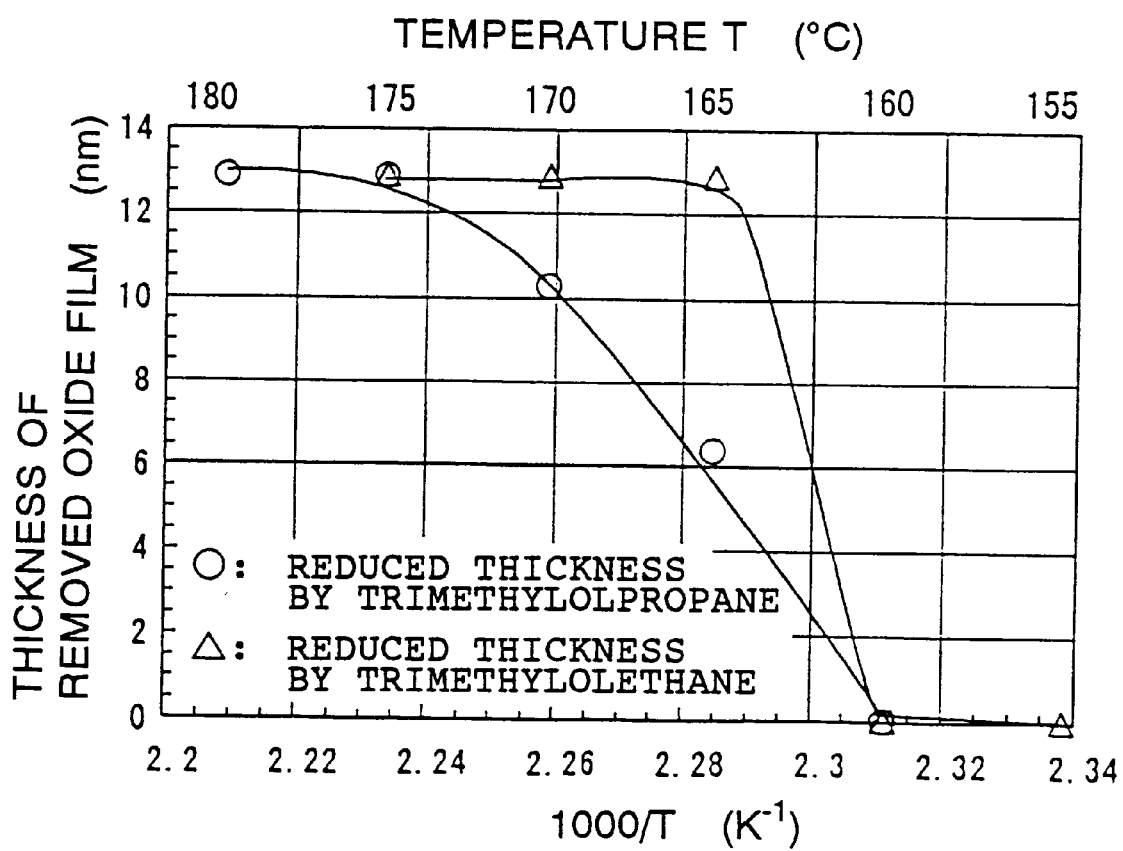
FIG. 19 is a graph showing a relationship between the temperature and the thickness of the copper oxide film removed by trimethylolpropane and trimethylolethane.

FIG. 19 shows the results of measurement given when trimethylolpropane or trimethylolethane is coated on the copper oxide substrate by the method shown in FIG. 18. According to FIG. 19, trimethylolpropane causes the reduction at approximately 160° C., and can be completely removed at 175° C. Therefore, the retention at approximately 170° C. is preferable.

The present inventors have investigated the same reducibility of the trimethylolethane paste, and have found that the excellent wettability is also shown by the retention at approximately 165° C.

On the other hand, the wettability of the trimethylolpropane paste in the retention profile at approximately 165° C. is not as good as that in the retention profile at approximately 170° C.

Thus, the profile in which the material coated on the metallic oxide is retained in the reduction region is important in obtaining the wettability, and the retention temperature varies depending on the materials.

Figure 20:
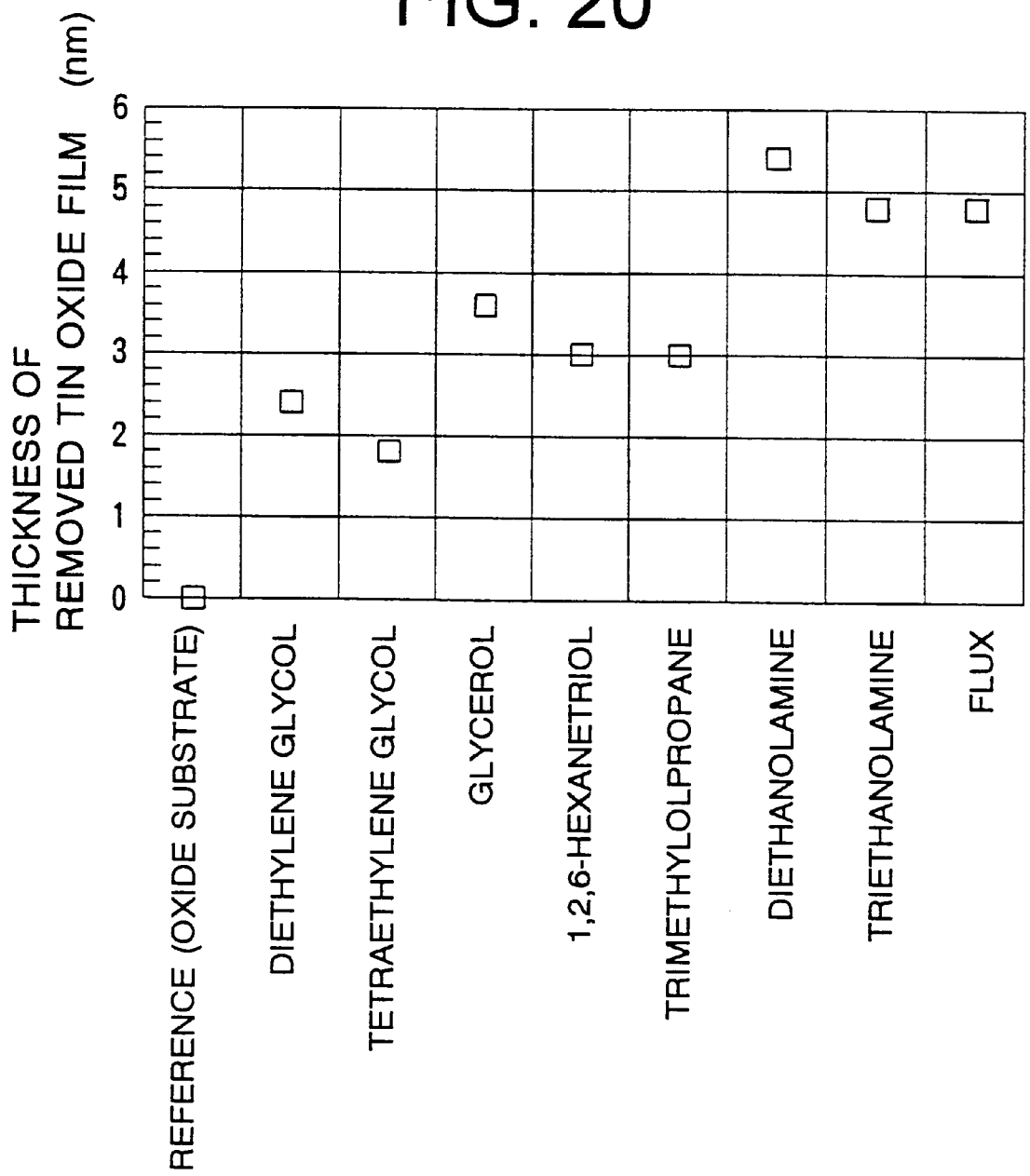
FIG. 20 is a graph showing a relationship between the material and the thickness of the tin oxide film which can be removed when the Sn-plated substrate is retained at 180° C. for 1 minute.

As shown in FIG. 20, the present inventors have investigated the ability to remove the oxide film of not only the copper substrate but also the tin substrate with respect to various materials.

In this Example, the reflow-soldering is conducted in the temperature profile shown in FIG. 17. However, the soldering is possible without especially setting the retention time. The retention of the material for approximately 10 seconds gives excellent effects, showing the excellent wettability compared with the case where the material is unretained. The retention time is between approximately 10 seconds and approximately 5 minutes, preferably between approximately 1 and 2 minutes.

Since the data of the change in the mass % measured by TG is given by the measurement at 10° C./min, it is preferable that the average rate of actual temperature rise be not lower than 10° C./min. It is more preferable that the temperature rise at an average rate of not lower than 10° C./min from a temperature at which to start evaporation. For example, the eutectic solder drastically starts evaporation at approximately 170° C. according to the data of each material obtained by TG as shown in FIGS. 8 to 12. Accordingly, when the temperature rises slowly from the retention temperature in the temperature profile of the reflow-soldering, the solvent is evaporated before melting the solder, and the surface tension of the solder cannot be decreased in melting the solder. For this reason, the rate of temperature rise has to be defined at a temperature of higher than a temperature at which the solvent is drastically evaporated. Whereas, when the temperature is lower than the above-mentioned temperature, almost no evaporation of the solvent occurs, and it is unnecessary to especially define the rate of temperature rise.

Figure 21:
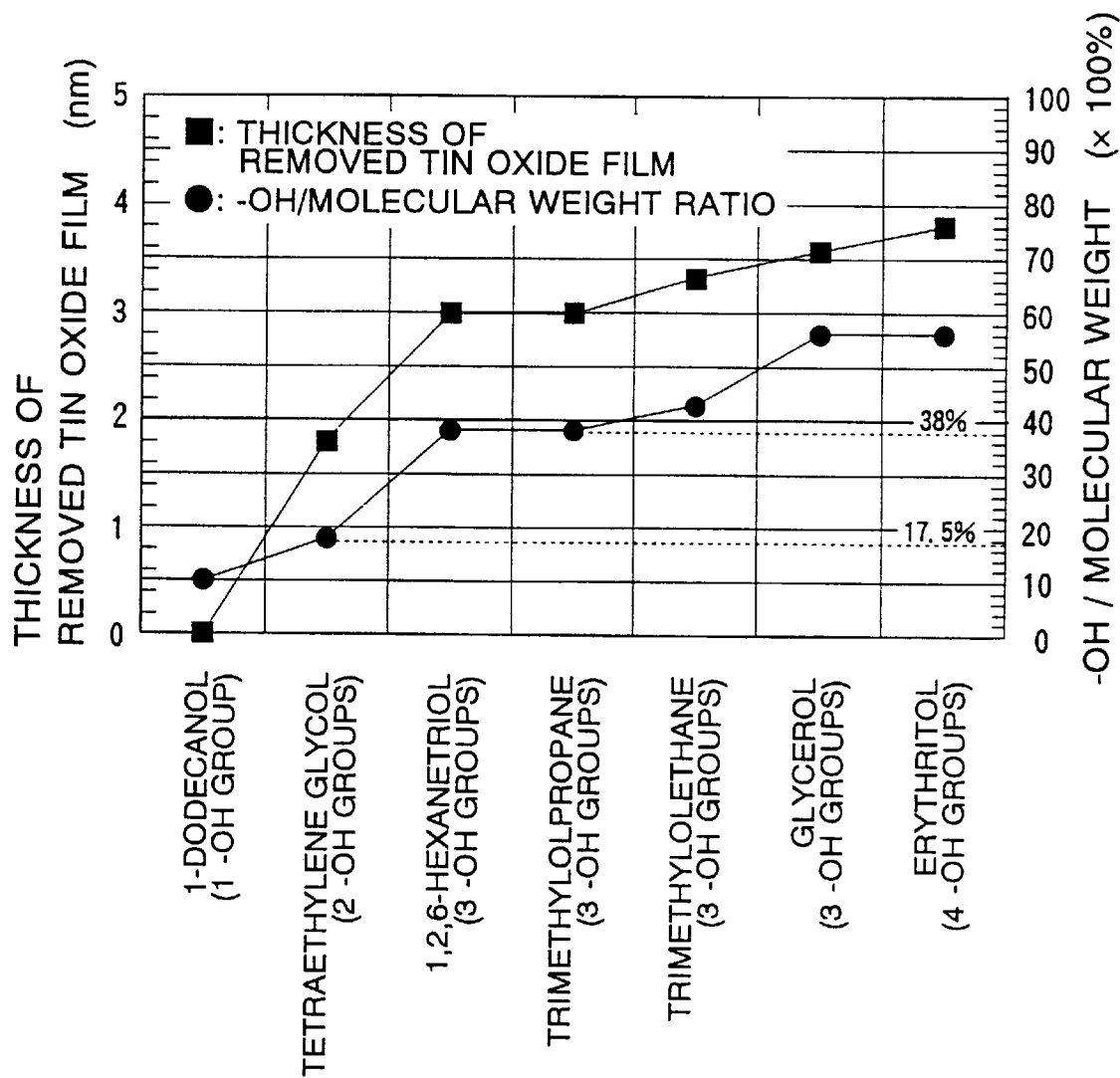
FIG. 21 is a graph showing a relationship between the —OH/molecular weight ratio and the thickness of the removed Sn oxide film.

Besides the number of —OH groups in a molecule, the ratio of —OH groups to the molecule is considered as a standard by which to measure the reducibility. FIG. 21 shows a relationship between —OH group/molecular weight×100(%) and the thickness of the oxide film which can be removed.

FIG. 21 reveals that the materials of which the —OH group/molecular weight×100 value exceeds approximately 17.5% have the reducibility (from approximately 1 and 2 nm) by which the natural oxide film can be removed from the materials, and that the higher the ratio of —OH groups to the molecular weight, the higher the reducibility. From FIG. 21, it becomes apparent that the reducibility required for the paste (at least three —OH groups) is given when the —OH group/molecular weight×100 value is approximately 38% or more.

EXAMPLE 13

Commercial 1,2,6-hexanetriol (made by Wako Pure Chemical Industries, Ltd.) is distilled under reduced pressure by means of a rotary pump. The distillation can be conducted at a temperature of from approximately 180° C. to 190° C. and a pressure of approximately 5 mmHg. However, in order to remove only impurities such as high-temperature ingredients (oxides), the precision distillation is not necessarily required. The commercial 1,2,6-hexanetriol is a bit yellow-colored, but after the distillation, it shows colorless transparency.

A thick copper film having a pitch of 300 μm, 150 μm, 75 μm or 50 μm is mounted opposite to this material. The distilled 1,2,6-hexanetriol or the undistilled 1,2,6-hexanetriol is coated on a substrate for measuring insulation resistance, and the resulting substrate is reflow-soldered in an oven of a nitrogen atmosphere.

Figure 22:
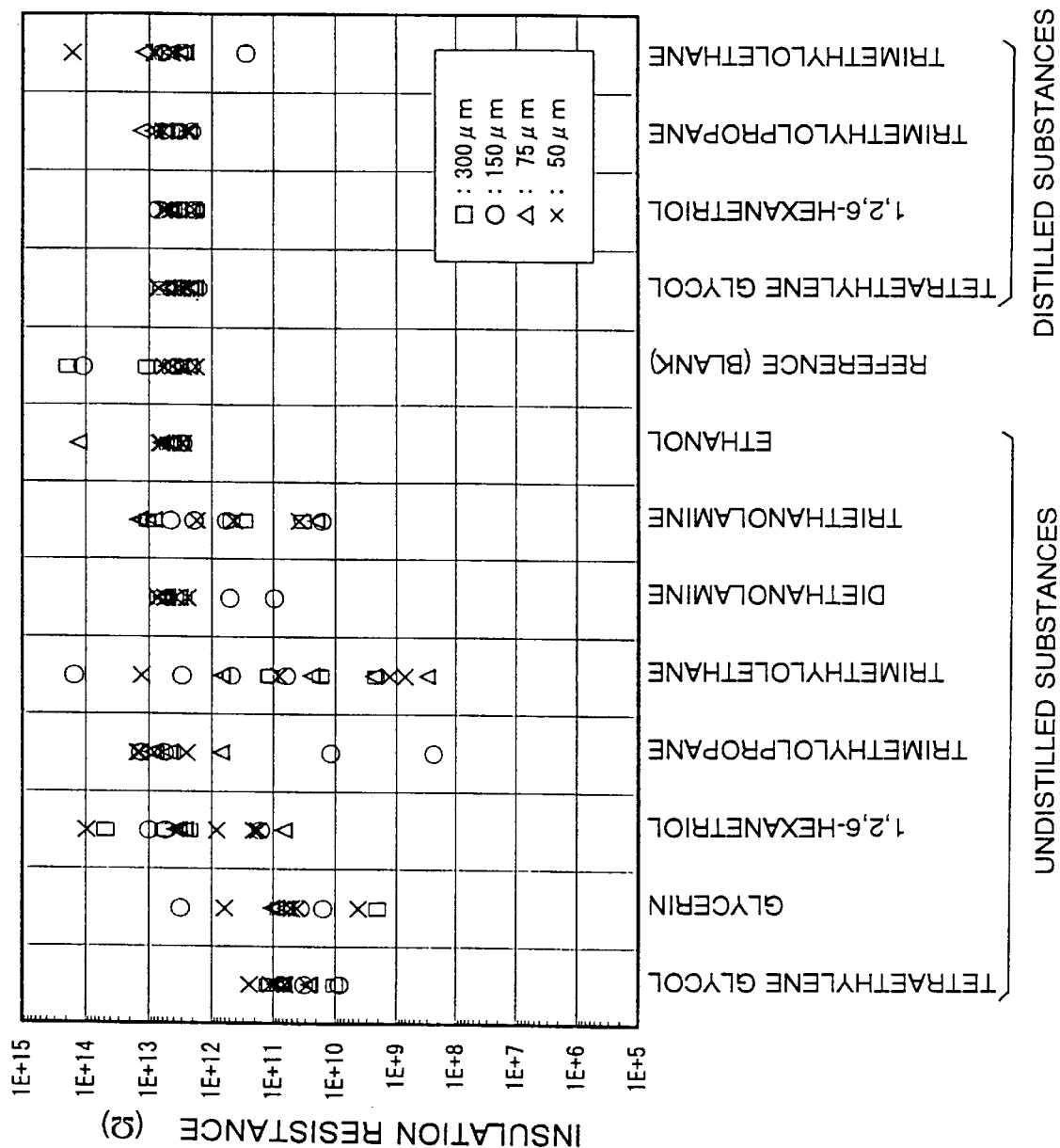
FIG. 22 is a graph showing a relationship between the material and the initial insulation resistance depending on the distillation treatment.

The results of the comparison between the distilled and undistilled materials with respect to the initial insulation resistance are shown in FIG. 22. From FIG. 22, the insulation resistances of the undistilled materials are quite irregular and lower. Meanwhile, the insulation resistance of a commercial alcohol of usual purity such as ethanol which does not have a high boiling point is not irregular, and can be used as such without the distillation.

Tetraethylene glycol and glycerin are also distilled and subjected to the measurement of insulation resistance. On the other hand, since trimethylolpropane and trimethylolethane are solid at room temperature, an attempt is made to improve the purity thereof through recrystallization, but the effect is not good. Accordingly, these materials are subjected to forced distillation like the materials which are liquid at room temperature. As a result, the same effect as that of the other materials can be obtained.

The forced distillation is conducted under reduced pressure using an ordinary still (glass tool) for distilling a liquid with a Liebig condenser removed, and the material attached to the inside of the glass is taken off. Since trimethylolethane sublimates at a temperature lower than the melting point, the material collected after the sublimation gives also the same effect. Further, trimethylolpropane has a melting point of 58° C. Therefore, when this material is distilled by heating the still using a drier, it can easily be collected in liquid state.

EXAMPLE 14

Figure 23:
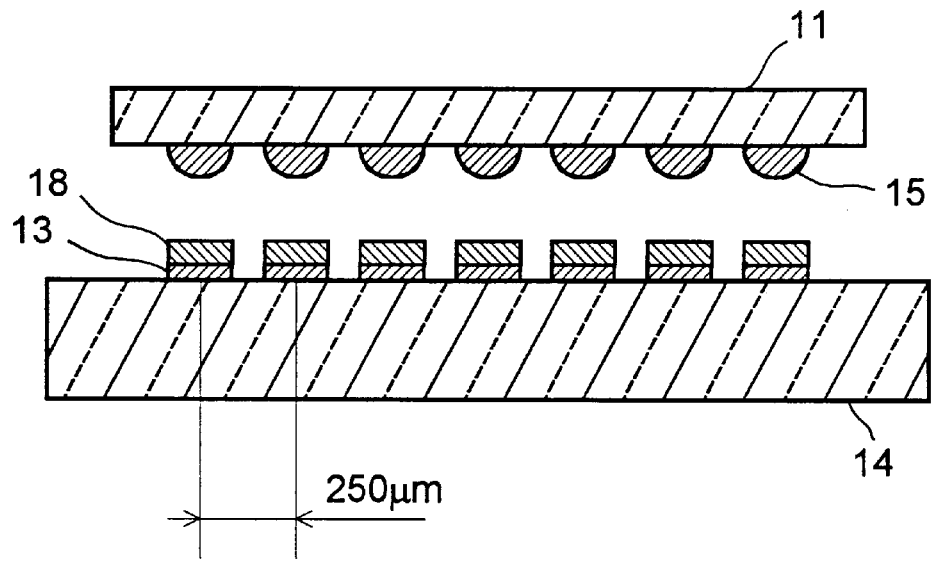
FIG. 23 is a schematic sectional view of a fine flip chip in Example 14.

Distilled 1,2,4-butanetriol as the specific organic substance 18 is thin-coated on a wiring pattern formed with Cu conductors 13 at a pitch of 250 μm using a swab as shown in FIG. 23. A flip chip IC 11 (composed of 224 bumps) formed at a pitch of 250 μm is mounted on the wiring using a high-precision mounter. An electrode 15 of the flip chip IC 11 is obtained by forming a solder containing 71% of Sn and a balance of Pb on a Cu bump. Then, the resulting product is reflow-soldered in an oven of nitrogen atmosphere at a peak temperature of approximately 240° C.

Consequently, the solder is not applied to the Cu conductors 13, and the soldering can be conducted well even at a fine pitch of 250 μm.

When the reflow-soldering peak temperature is elevated by from approximately 10 to 20° C. and 1,2,6-hexanetriol or pentaethylene glycol is used as the coating material, the excellent soldering can be conducted even with a solder of approximately 100% of Sn or a Ag—Sn eutectic crystal.

A polyhydric alcohol having strong viscosity, such as 1,2,6-hexanetriol, exhibits poor wettability to a substrate, which means that it repels. A portion having poor bondability is formed on a big chip having a size of approximately 15 to 20 mm, such as a driver IC, by some coating method. The excellent soldering method is mentioned below.

1,2,6-Hexanetriol is used as a solvent having poor wettability to the substrate, and tetraethylene glycol is used as a solvent having good wettability to the substrate. A mixed solution thereof is prepared at a mixing ratio of 10:1 (mass ratio).

Since this mixed solution gives lower surface tension to the substrate than 1,2,6-hexanetriol alone, it can be uniformly thin-coated on the substrate. Thereafter, a flip chip IC is mounted thereon using a mounter, and the reflow-soldering is conducted in a nitrogen atmosphere. It is confirmed that this mixed solution is also available as a dipping flux.

The solvent having poor wettability to the substrate includes 1,2,4-butanetriol, 3-methylpentane-1,3,5-triol and glycerin. The solvent having good wettability to the substrate includes 1,5-pentanediol, tetraethylene glycol, triethylene glycol, diethylene glycol and 3-methyl-1,5-pentanediol. A mixture of these solvents at a desired mixing ratio improves the wettability to the substrate, and can be uniformly thin-coated. As a result, the solderability can be improved.

EXAMPLE 15

Figure 24:
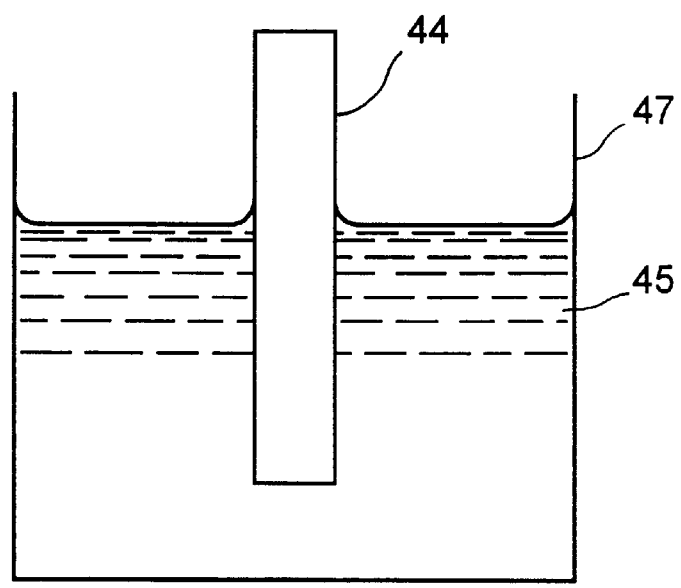
FIG. 24 is a schematic view showing a solder-dipping method.

1,2,6-Hexanetriol among the materials shown in Tables 5 and 6 is coated as a flux material on a ceramic substrate having a wiring formed of an Ag-type or Cu-type thick film. As shown in FIG. 24, this substrate is vertically dipped for approximately 2 seconds in a soldering bath 47 filled with a molten solder 45 which is composed of 62% of Sn, 2% of Ag and a balance of Pb and which is retained at approximately 235° C. Then, when the substrate is drawn up at an angle of approximately 45° relative to the liquid level, a small amount of the material remains on the surface of the substrate. In this state, the substrate 44 is redipped vertically in the soldering bath 47 for approximately 3 seconds, and is then drawn up slowly at an angle of approximately 45° relative to the liquid level.

The thus-dipped substrate 44 can be soldered well regardless of the shape and the size of the land portion in which almost no flux remains. Even if the flux remains, the amount thereof is small. The remaining flux is not carbonized and therefore can be removed with ethanol or the like. Or the remaining flux is evaporated after the completion of the reflow-soldering, and does not finally remain as a residue. When the components are mounted on this substrate as in Example 1, all of the steps can be conducted without washing.

In this Example, the thick film is used in the substrate material. However, a solderable plate metal can be also used in the substrate wiring material.

In the above-mentioned explanation, the material is coated on the substrate. It is also confirmed that the soldering can be also conducted by directly feeding the material to the soldering bath and dipping the substrate therein.

EXAMPLE 16

A ceramic substrate having a wiring formed of an Ag-type or Cu-type thick film is vertically dipped in 100% of 1,5-pentanediol [containing two —OH groups and having an evaporation temperature (temperature with mass %=approximately 0%) of 190.8° C.] for approximately 5 seconds. Then, the substrate is vertically withdrawn from the solution, suspended vertically for approximately 30 seconds, and vertically dipped slowly in a soldering bath which is filled with a solder made of 62% of Sn, 2% of Ag and a balance of Pb and which is kept at approximately 235° C. After the substrate is suspended in the soldering bath for approximately 2 seconds, a trace amount of 1,5-pentanediol remains on the surface of the substrate. Since the substrate is heated, 1,5-pentanediol is completely evaporated in approximately scores of seconds.

The thus-dipped substrate can be soldered well regardless of the size and the shape of the land portion without leaving any solvent on the surface of the substrate. In the dipping using propylene glycol of which the evaporation temperature (approximately 150° C.) measured by TG is lower than 190° C., the solvent is already evaporated when the substrate is withdrawn after the completion of the dipping. Thus, the solder residue is adhered to the substrate in a large amount. Meanwhile, with glycerin of which the evaporation temperature (approximately 230° C.) measured by TG is higher than 190° C., the good soldering is possible, but the solvent which is not completely evaporated by one dipping remains. Accordingly, it can be said that the material containing two or more —OH groups and having the evaporation temperature of approximately 190° C. allows the soldering by one dipping and can be completely evaporated.

If the material having the evaporation temperature of not lower than 190° C. is dried after the completion of the dipping, the dip-soldering can be conducted without washing.

When the components are mounted on the thus-dipped substrate as in Example 1, all of the steps can be conducted without washing.

It is confirmed that 3-methyl-1,5-pentanediol and diethylene glycol having the same TG properties as 1,5-pentanediol can give the same results as 1,5-pentanediol.

This Example uses the ceramic substrate. It is confirmed that the print substrate enables the same dipping.

EXAMPLE 17

In this Example, it is demonstrated that solvents which singly do not exhibit the wettability are mixed with each other and the resulting mixture exhibits the wettability. A mixture of n-dodecanol and octylene glycol is taken for example. These materials do not singly exhibit the wettability. That is, n-dodecanol containing one —OH group has poor reducibility, but the temperature thereof at which the mass % becomes approximately 0% is 190° C. Accordingly, this material acts to decrease the surface tension of the solder when melting the solder. On the other hand, octylene glycol has the above-mentioned temperature of 180° C., and therefore it scarcely acts to decrease the surface tension when melting the solder. However, since this material has two —OH groups, the reducibility is sufficient. In this manner, the mixture of the materials that offset the defects thereof may be used in a flux. When approximately 10 g of n-dodecanol is actually mixed well with approximately 20 g of octylene glycol and components are mounted as in Example 1 using this mixture, the soldering can be surely conducted. Further, the soldering can be conducted using an OH-free alkane (n-hexadecane) instead of the above-mentioned n-dodecanol.

The soldering can be conducted with excellent solder wettability and spreadability and without leaving any residue, using the soldering flux containing at least one substance which has at least two —OH groups in a molecule and of which the mass % becomes at least 18% as measured by TG at a solder melting point of not lower than 170° C. under the predetermined conditions.

The soldering can be also conducted with excellent solder wettability and spreadability and without leaving any residue, using the soldering flux containing at least one substance which has at least two —OH groups in a molecule and of which the temperature at which the mass % becomes approximately 0% is not lower than 170° C. and not lower than the melting point (solid phase linear temperature) of the solder, as measured by TG under the predetermined conditions. The dip-soldering may be conducted using this soldering flux.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A soldering method comprising the steps of:
   feeding to a soldering portion of a work a soldering paste comprising a solder powder and a solvent containing an organic substance which has at least three hydroxyl (—OH) groups in a molecule and of which the temperature at which the mass % becomes approximately 0% is not lower than approximately 235° C. and not lower than the solid phase linear temperature of a solder, as measured by thermal gravimetry in which a flow rate of an air or nitrogen ($N_2$) gas atmosphere is 200 ml/min and a ratio of temperature rise is 10° C./min;
   placing the work in an atmosphere capable of elevating a temperature; and
   soldering the soldering portion.

2. A soldering method comprising the steps of:
   feeding to a soldering portion of a work, together with a solder, a flux containing an organic substance which has at least two hydroxyl (—OH) groups in a molecule and of which the temperature at which the mass % becomes approximately 0% is not lower than approximately 170° C. and not lower than the solid phase linear temperature of the solder, as measured by thermal gravimetry in which a flow rate of an air or nitrogen ($N_2$) gas atmosphere is 200 ml/min and a ratio of temperature rise is 10° C./min;
   placing the work in an atmosphere capable of elevating a temperature; and
   soldering the soldering portion.

3. A soldering method of claim 1, wherein the step of soldering the soldering portion including steps of:
   elevating the temperature up to a first temperature;
   maintaining the first temperature for a predetermined period of time; and elevating the first temperature up to a second temperature at a rate of temperature rise of not less than 10° C./min on average.

4. A soldering method of claim 1, wherein the atmosphere in which the work is placed for soldering is non-reductive.

5. A soldering method of claim 2, wherein the step of soldering the soldering portion includes a step of elevating the temperature at a rate of temperature rise of not less than 10° C./min on average in a temperature range of not lower than the solid phase linear temperature of the solder.

6. A soldering method of claim 2, wherein the atmosphere in which the work is placed for soldering is non-reductive.

7. A soldering method comprising the steps of:

contacting soldering portions of first and second works with a soldering paste and a flux interposed therebetween, at least one of the soldering paste and the flux containing an organic substance which has at least two hydroxyl (—OH) groups in a molecule and of which the temperature at which the mass % becomes approximately 0% is not lower than approximately 170° C. and not lower than the solid phase linear temperature of the solder, as measured by thermal gravimetry in which a flow rate of an air or nitrogen ($N_2$) gas atmosphere is 200 ml/min and a ratio of temperature rise is 10° C./min; and soldering the soldering portions of the first and second works to one another.

8. A soldering method of claim 7, wherein the flux includes the organic substance.

9. A soldering method of claim 7, wherein the soldering paste includes the organic substance which has at least three hydroxyl (—OH) groups in a molecule and of which the temperature at which the mass % becomes approximately 0% is not lower than approximately 235° C., as measured by thermal gravimetry in which the flow rate of the air or nitrogen (No) gas atmosphere is 200 ml/min and the ratio of temperature rise is 10° C./min.

10. A soldering method of claim 7, wherein the step of soldering the soldering portions is carried out in a non-reductive atmosphere.

11. A soldering method of claim 7, wherein the step soldering the soldering portion includes steps of:

elevating the temperature up to a first temperature;

maintaining the first temperature for a predetermined period of time; and elevating the first temperature up to a second temperature at a rate of temperature rise of not less than 10° C./min on average.

12. A soldering method of claim 3, wherein the first temperature is set relative to a temperature at which the organic substance of the solvent exhibits reducibility to a metallic oxide of the soldering portion.

13. A soldering method of claim 3, wherein the first temperature is not lower than approximately 160° C. and not higher than the melting point of the solder.

14. A soldering method of claim 3, wherein the second temperature is approximately 240° C.

15. A soldering method of claim 3, wherein the predetermined period of time for maintaining the first temperature is between approximately 10 seconds and 5 minutes.

16. A soldering method of claim 3, wherein the predetermined period of time for maintaining the first temperature is between approximately 1 and 2 minutes.

17. A soldering method of claim 1, wherein before the step of feeding the soldering paste, a step of kneading the solder powder with the solvent to form the soldering paste is conducted which includes a step of distilling the organic substance of the solvent before the kneading.

18. A soldering method of claim 1, wherein the solvent of the soldering paste is composed mainly of at least one type selected from 1,2,6-hexanetriol, 1,2,4-butanetriol, erythritol, pentaerythritol and ribitol.

19. A soldering method of claim 1, wherein the solvent of the soldering paste is composed mainly of a first component which is at least one type selected from tetraethylene glycol, hexaethylene glycol and pentaethylene glycol, and a second component which is at least one type selected from 1,2,3-hexanetriol, 3-methylpentane-1,3,5-triol, glycerin, trimethylolpropane and trimethylolethane.

20. A soldering method of claim 5, wherein the step of elevating the temperature includes a step of maintaining approximately the same temperature for a predetermined period of time in the temperature range of not higher than the solid phase linear temperature of the solder.

21. A soldering method of claim 20, wherein the temperature to be maintained is not lower than approximately 160° C. and not higher than the melting point of the solder, and the predetermined period of time for maintaining the temperature is between 10 seconds and 5 minutes.

22. A soldering method of claim 5, wherein the temperature is elevated at up to approximately 240° C. in the step of elevating the temperature.

23. A soldering method of claim 2, wherein a step of distilling the organic substance is conducted before the step of feeding the flux.

24. A soldering method of claim 2, wherein the flux is composed of at least one type selected from 1,5-pentanediol, 3-methyl-1,5-pentanediol and diethylene glycol, and the solder is fed by flowing or dipping.

25. A soldering method of claim 2, wherein the flux contains an organic substance containing at least three hydroxyl (—OH) groups in a molecule, and the solder is fed by flowing or dipping.

* * * * *